United States Patent
Gotou et al.

(10) Patent No.: US 8,786,090 B2
(45) Date of Patent: Jul. 22, 2014

(54) AL ALLOY FILM FOR DISPLAY DEVICE, DISPLAY DEVICE, AND SPUTTERING TARGET

(75) Inventors: Hiroshi Gotou, Kobe (JP); Katsufumi Tomihisa, Kobe (JP); Aya Hino, Kobe (JP); Hiroyuki Okuno, Kobe (JP); Junichi Nakai, Kobe (JP); Nobuyuki Kawakami, Kobe (JP); Mototaka Ochi, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 712 days.

(21) Appl. No.: 12/312,907

(22) PCT Filed: Nov. 27, 2007

(86) PCT No.: PCT/JP2007/072832
§ 371 (c)(1),
(2), (4) Date: Jun. 1, 2009

(87) PCT Pub. No.: WO2008/066030
PCT Pub. Date: Jun. 5, 2008

(65) Prior Publication Data
US 2010/0065847 A1 Mar. 18, 2010

(30) Foreign Application Priority Data
Nov. 30, 2006 (JP) .................................. 2006-324494
Jun. 26, 2007 (JP) .................................. 2007-168298

(51) Int. Cl.
*H01L 29/43* (2006.01)

(52) U.S. Cl.
USPC .................................. 257/765; 257/E33.063

(58) Field of Classification Search
USPC ...................... 257/59, 765, E33.063, E33.064
See application file for complete search history.

(56) References Cited

U.S. PATENT DOCUMENTS

| 5,514,909 A | 5/1996 | Yamamoto et al. |
| 6,033,542 A | 3/2000 | Yamamoto et al. |
| 6,096,438 A | 8/2000 | Takagi et al. |

(Continued)

FOREIGN PATENT DOCUMENTS

| JP | 9 186238 | 7/1997 |
| JP | 11 283934 | 10/1999 |

(Continued)

OTHER PUBLICATIONS

U.S. Appl. No. 12/812,913, filed Jul. 14, 2010, Ochi, et al.

(Continued)

*Primary Examiner* — Wensing Kuo
(74) *Attorney, Agent, or Firm* — Oblon, Spivak, McClelland, Maier & Neustadt, L.L.P.

(57) ABSTRACT

The present invention provides an Al alloy film for a display device, to be directly connected to a conductive oxide film on a substrate, the Al alloy film comprising Ge in an amount of 0.05 to 0.5 at %, and comprising Gd and/or La in a total amount of 0.05 to 0.45 at %, a display device using the same, and a sputtering target for the display device. For the Al alloy film of the present invention, even when a barrier metal is not provided, and a conductive oxide film and the Al alloy film are directly connected, the adhesion between the conductive oxide film and the Al alloy film is high, and the contact resistivity is low, and preferably, the dry etching property is also excellent.

26 Claims, 13 Drawing Sheets

(56) References Cited

U.S. PATENT DOCUMENTS

| | | |
|---|---|---|
| 6,218,206 B1 | 4/2001 | Inoue et al. |
| 6,252,247 B1 | 6/2001 | Sakata et al. |
| 7,098,539 B2 | 8/2006 | Gotoh et al. |
| 7,154,180 B2 | 12/2006 | Gotoh et al. |
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 2003/0047812 A1 | 3/2003 | Hagihara et al. |
| 2004/0126608 A1 | 7/2004 | Gotoh et al. |
| 2005/0118811 A1* | 6/2005 | Murata .......................... 438/688 |
| 2006/0091792 A1 | 5/2006 | Kugimiya et al. |
| 2006/0180250 A1 | 8/2006 | Kugimiya et al. |
| 2006/0181198 A1* | 8/2006 | Gotoh et al. ................... 313/503 |
| 2006/0237849 A1 | 10/2006 | Gotoh et al. |
| 2006/0275618 A1 | 12/2006 | Kugimiya et al. |
| 2007/0040173 A1 | 2/2007 | Kugimiya et al. |
| 2007/0278497 A1 | 12/2007 | Kawakami et al. |
| 2008/0081532 A1 | 4/2008 | Okuno et al. |
| 2008/0121522 A1 | 5/2008 | Ehira et al. |
| 2008/0223718 A1 | 9/2008 | Takagi et al. |
| 2008/0315203 A1 | 12/2008 | Hino et al. |
| 2009/0001373 A1 | 1/2009 | Ouchi et al. |
| 2009/0004490 A1 | 1/2009 | Gotou et al. |
| 2009/0011261 A1 | 1/2009 | Gotou |
| 2009/0176113 A1 | 7/2009 | Gotoh et al. |

FOREIGN PATENT DOCUMENTS

| | | |
|---|---|---|
| JP | 11 284195 | 10/1999 |
| JP | 11 337976 | 12/1999 |
| JP | 2003 273109 | 9/2003 |
| JP | 2004 55842 | 2/2004 |
| JP | 2004 214606 | 7/2004 |
| JP | 2005 171378 | 6/2005 |
| JP | 2006 261636 | 9/2006 |
| WO | 97 13885 | 4/1997 |

OTHER PUBLICATIONS

U.S. Appl. No. 12/918,727, filed Aug. 20, 2010, Miki, et al.
U.S. Appl. No. 12/922,764, filed Sep. 15, 2010, Goto, et al.
U.S. Appl. No. 12/922,965, filed Sep. 16, 2010, Nakai, et al.
U.S. Appl. No. 12/936,572, filed Oct. 6, 2010, Kawakami, et al.
U.S. Appl. No. 12/999,034, filed Dec. 14, 2010, Kawakami, et al.
U.S. Appl. No. 13/056,444, filed Jan. 28, 2011, Onishi, et al.
U.S. Appl. No. 12/376,863, filed Feb. 9, 2009, Hino, et al.
U.S. Appl. No. 12/528,008, filed Aug. 20, 2009, Gotou, et al.
U.S. Appl. No. 13/122,937, filed Apr. 6, 2011, Nanbu, et al.
U.S. Appl. No. 13/126,126, filed Apr. 26, 2011, Ochi, et al.
U.S. Appl. No. 12/681,542, filed Apr. 2, 2010, Ochi, et al.
U.S. Appl. No. 13/320,673, filed Nov. 15, 2011, Tanifuji, et al.
U.S. Appl. No. 13/144,716, filed Jul. 15, 2011, Goto, et al.
U.S. Appl. No. 13/254,316, filed Sep. 1, 2011, Kobayashi, et al.
U.S. Appl. No. 13/286,284, filed Nov. 1, 2011, Gotoh, et al.
U.S. Appl. No. 13/581,436, filed Aug. 27, 2012, Iwasaki, et al.
U.S. Appl. No. 13/387,522, filed Jan. 27, 2012, Goto, et al.
U.S. Appl. No. 13/387,557, filed Jan. 27, 2012, Maeda, et al.

* cited by examiner

TEG PATTERN

AL ALLOY FILM FOR DISPLAY DEVICE, DISPLAY DEVICE, AND SPUTTERING TARGET

TECHNICAL FIELD

The present invention relates to an Al alloy film for a display device for use in a liquid crystal display, a semiconductor, an optical component, or the like, a display device, and a sputtering target for a display device. More particularly, it relates to a novel wiring material including an Al alloy film as a constituent element.

BACKGROUND ART

Liquid display devices for use in various fields from compact cellular phones to more than 30-inch large-size televisions are classified into simple matrix type liquid crystal display devices and active matrix type liquid crystal display devices according to the driving method of pixels. Out of these, an active matrix type liquid crystal display device having a thin film transistor (which is hereinafter referred to as a TFT) as a switching element can implement a high precision image quality; and is adaptable to high-speed images or the like, and hence it has been used for general purposes.

With reference to FIG. 1, a description will be given to the configuration and the operational principle of a typical liquid crystal display to be applied to an active matrix type liquid crystal display device. Herein, the description will be given by taking a TFT substrate using hydrogenated amorphous silicon as an active semiconductor layer (which may be hereinafter referred as an amorphous silicon TFT substrate) as a typical example, which is non-limiting. A TFT substrate using polysilicon is also acceptable.

As shown in FIG. 1, the liquid crystal display has a TFT substrate 1, an opposing substrate 2 disposed opposite the TFT substrate 1, and a liquid crystal layer 3 disposed between the TFT substrate 1 and the opposing substrate 2, and functioning as an optical modulation layer. The TFT substrate 1 has a TFT 4 disposed on an insulating glass substrate 1a, a transparent pixel electrode 5, and a wiring part 6 including a scanning line and a signal line. The transparent pixel electrode 5 is formed of a conductive oxide film such as an indium tin oxide (ITO) film comprising tin oxide (SnO) in an amount of about 10 mass % in indium oxide ($In_2O_3$). The TFT substrate 1 is driven by a driver circuit 13 and a control circuit 14 connected through a TAB tape 12.

The opposing substrate 2 has, on the TFT substrate 1 side, a common electrode 7 formed over the entire surface of an insulating glass substrate 1b, a color filter 8 disposed at position opposite the transparent pixel electrode 5, and a light shield film 9 disposed in a position opposite the TFT 4 and the wiring part 6 on the TFT substrate 1. The opposing substrate 2 further has an alignment film 11 for aligning liquid crystal molecules (not shown) comprised in the liquid crystal layer 3 in a predetermined orientation.

On the outsides of the TFT substrate 1 and the opposing substrate 2 (on the opposite sides from the liquid crystal layer 3 side), polarizing plates 10 are disposed, respectively.

With the liquid crystal display, the alignment direction of liquid crystal molecules in the liquid crystal layer 3 is controlled by the electric field formed between the opposing electrode (not shown) and the transparent pixel electrode 5. Thus, the light passing through the liquid crystal layer 3 is modulated. As a result of this, the amount of light passing through the opposing substrate 2 is controlled, so that an image is displayed.

Then, with reference to FIG. 2, the configuration and the operational principle of a conventional amorphous silicon TFT substrate to be preferably used for a liquid crystal display will be described in details. FIG. 2 is an enlarged view of the essential part of A in FIG. 1.

As shown in FIG. 2, on a glass substrate (not shown), a scanning line (gate wire) 25 is formed. A part of the scanning line 25 functions as a gate electrode 26 for controlling ON/OFF of the TFT. A gate insulation film (silicon nitride film) 27 is formed in such a manner as to cover the gate electrode 26. A signal line (source-drain wire) 34 is formed in such a manner as to cross with the scanning line 25 via the gate insulation film 27. Thus, a part of the signal line 34 functions as a source electrode 28 of the TFT. On the gate insulation film 27, an amorphous silicon channel film (active semiconductor film, not shown), the signal line (source-drain wire) 34, and an interlayer insulation silicon nitride film (protective film) 30 are sequentially formed. This type is generally also referred to as a bottom gate type.

The amorphous silicon channel film includes an intrinsic layer not doped with P (phosphorus) (i layer, which is also referred to as a nondoping layer), and a doped layer (n layer) doped with P. In the pixel region on the gate insulation film 27, for example, the transparent pixel electrode 5 formed of an ITO film comprising SnO in $In_2O_3$ is disposed. The drain electrode 29 of the TFT is electrically connected to the transparent pixel electrode 5.

When a gate voltage is supplied to the gate electrode 26 via the scanning line 25, the TFT 4 is rendered in an ON state. Thus, the driving voltage previously supplied to the signal line 34 is supplied from the source electrode 28 to the transparent-pixel electrode 5 via the drain electrode 29. Then, when a driving voltage at a predetermined level is supplied to the transparent pixel electrode 5, as described in connection with FIG. 1, a potential difference is caused between the transparent pixel electrode 5 and the opposing electrode. As a result, the liquid crystal molecules comprised in the liquid crystal layer 3 are aligned, so that optical modulation is carried out.

In the TFT substrate 1, the signal line (signal line for the pixel electrode) to be electrically connected to the transparent pixel electrode 5, the source-drain wire 34 to be electrically connected to the source electrode 28-drain electrode 29, and the scanning line 25 to be electrically connected to the gate electrode 26 are all formed of a thin film of pure Al or an Al alloy such as Al—Nd (which is hereinafter referred to as an Al type thin film in the column of Background art) because of the low electric resistivity, ease of micromachining, and other reasons. Thereon and thereunder, as shown in FIG. 2, there are formed barrier metal layers 51, 52, 53, and 54 including a refractory metal such as Mo, Cr, Ti, or W.

Herein, the reason why the Al type thin film is connected to the transparent pixel electrode 5 via the barrier metal layer 54 is as follows. When the Al type thin film is directly connected to the transparent pixel electrode 5, the coupling resistance (contact resistance) increases, resulting in degradation of the display quality of the screen. Namely, Al forming the wire to be directly connected to the transparent pixel electrode is very susceptible to oxidation. Thus, by oxygen formed in the process of deposition of the liquid crystal display, oxygen to be added during deposition, or the like, an insulation layer of an Al oxide is formed at the interface between the Al type thin film and the transparent pixel electrode. Further, the ITO forming the transparent pixel electrode is a conductive metal oxide. However, electric ohmic coupling cannot be carried out due to the Al oxide layer formed in the foregoing manner.

However, in order to form the barrier metal layer, a deposition chamber for barrier metal formation must be additionally mounted in addition to a sputtering device for deposition necessary for the formation of the gate electrode and the source electrode, and further the drain electrode. With the advance of reduction of cost with the trend for the mass production of liquid crystal displays, the increase in manufacturing cost and the reduction of the productivity entailed by formation of the barrier metal layer have become impossible to disregard.

Under such circumstances, there have been proposed wiring materials and manufacturing methods of electrodes and the like which can omit the formation of the barrier metal layer, and enables direct coupling of the Al type thin film to the transparent pixel electrode.

For example, in Patent Document 1, there is disclosed a technology using an indium zinc oxide (IZO) film comprising zinc oxide in an amount of about 10 mass % in indium oxide as a material for the transparent pixel electrode. However, with this technology, the currently most commonly used ITO film must be changed to an IZO film, resulting in an increase in material cost.

In Patent Document 2, there is disclosed a method in which a drain electrode is subjected to a plasma treatment or ion implantation to modify the surface of the drain electrode. However, with this method, a step for surface treatment is added, resulting in reduction of productivity.

Whereas, in Patent Document 3, there is disclosed a method in which as a gate electrode, a source electrode, and a drain electrode, a first layer of pure Al or Al, and a second layer comprising impurities such as N, O, Si, or C in pure Al or Al are used. With this method, there is an advantage in that the thin films forming the gate electrode, the source electrode, and the drain electrode can be continuously formed by means of the same deposition chamber. However, a step of forming the second layer comprising the impurities is additionally imposed. Further, in the process of introducing impurities to the source-drain wire, a phenomenon that deposits of the source-drain wire flake off as flakes from the wall surface of the chamber frequently occurs due to the difference in coefficient of thermal expansion between the film including impurities mixed therein and the film not including impurities mixed therein. In order to prevent this phenomenon, it is necessary to frequently stop the deposition step, and to carry out maintenance, resulting in remarkable reduction of productivity.

In view of such circumstances, there is disclosed a method enabling omission of the barrier metal layer, and achieving simplification without increasing the number of steps, and thus capable of coupling the Al alloy film to the transparent pixel electrode directly and surely (Patent Document 4). In Patent Document 4, as the alloy component, an Al alloy comprising at least one selected from a group consisting of Au, Ag, Zn, Cu, Ni, Sr, Ge, Sm, and Bi in an amount of 0.1 to 6 at % is used. By allowing at least a part of these alloy components to be present as a deposit or a concentrated layer at the interface between the Al alloy film and the transparent pixel electrode, the foregoing problem is solved.

In Patent Document 4, for example, in the case of Al—Ni type alloys, the electric resistivities after a heat treatment at 250° C. for 30 minutes are as low as 3.8 μΩ·cm for Al-2 at % Ni, 5.8 μΩ·cm for Al-4 at % Ni, and 6.5 μΩ·cm for Al-6 at % Ni. Thus, when an Al alloy film thus controlled low in electric resistivity is used, the power consumption of the display device can be reduced, which is very useful. Further, when the electric resistivity of the electrode part decreases, the time constant determined by the product of the electric resistance and the electric capacitance also decreases. Therefore, even when the display panel is increased in size, it becomes possible to keep the high display quality. However, the heat resistance temperatures of the Al—Ni type alloys are all as low as roughly 150 to 200° C.

Then, in Patent Document 5, there is disclosed a thin film transistor substrate having a thin film transistor and a transparent pixel electrode, wherein Al alloy film and a conductive oxide film are directly connected with each other not via a refractory metal, and in the direct coupling interface, a part of, or the whole of the Al alloy component is present in a precipitated or concentrated form. The Al alloy film is a thin film transistor substrate including an Al-α-X alloy comprising, as alloy components, an element belonging to the group α in an amount in the range of 0.1 at % or more and 6 at % or less, and an element belonging to the group X in an amount in the range of 0.1 at % or more and 2.0 at % or less. The element belonging to the group α is at least one element selected from the group consisting of Ni, Ag, Zn, Cu, and Ge. The element belonging to the group X is at least one element selected from the group consisting of Mg, Cr, Mn, Ru, Rh, Pd, Ir, Pt, La, Ce, Pr, Gd, Tb, Sm, Eu, Ho, Er, Tm, Yb, Lu, and Dy.

It is regarded that use of the thin film transistor substrate enables omission of the barrier metal layer, and enables direct and reliable coupling of the Al alloy film to the pixel electrode including a conductive oxide film without increasing the number of steps. Further, it is regarded that, even when a heat treatment temperature as low as, for example, about 100° C. or more and 300° C. or less is applied to the Al alloy film, reduction of the electric resistivity between the pixel electrodes and excellent heat resistance can be achieved. Specifically, the following is described: for example, when a heat treatment at a temperature as low as 250° C.×30 minutes is adopted, it is possible to attain 7 μΩ·cm or less in terms of the electric resistivity of the Al type alloy thin film without causing defects such as hillocks.

Whereas, in Patent Document 6, there is described an Al alloy film for a wiring film comprising, as additional elements, Ge in an amount of 0.2 to 1.5 at %, and further comprising Ni in an amount of 0.2 to 2.5 at %, and the balance including Al. However, according to Table 1 of Patent Document 6, it is difficult to satisfy both the low electric resistivity and the favorable surface conditions.

On the other hand, in recent years, with a trend for a higher image quality and a higher definition of a liquid crystal display, miniaturization of the wire for an Al alloy film electrode (miniaturization of line width) has been advanced. Accordingly, the method of wiring formation has been being changed from a conventionally generally used wet etching method (a method for carrying out wiring patterning by etching with a chemical liquid) to a dry etching method (a method for carrying out wiring patterning by etching with a reactive plasma). With the wet etching method, there occurs a phenomenon called "side etching" that the chemical liquid runs to the underlying side of a resist which is a mask for patterning to etch the wiring sidewall. Therefore, it is difficult to precisely control the wiring dimensions/shape. In contrast, with a dry etching method, it is possible to carry out precise etching, and hence the method is excellent in fine processing of wiring. With dry etching, fine wiring with a line width of 2 μm or less can be formed. Whereas, when all the etching steps in TFT manufacturing can be carried out through dry etching, improvement of productivity can also be expected.

Thus, as a film for electrodes/a film for wiring suitable for dry etching, in Patent Document 7, there is disclosed an Al—Nd type alloy thin film comprising Nd in an amount of more than 0.1 at % to 1.0 at % in Al. However, the Al alloy thin film cannot be directly connected to transparent pixel electrodes.

Patent Document 1: Japanese patent laid-open No. 11-337976
Patent Document 2: Japanese patent laid-open No. 11-283934
Patent Document 3: Japanese patent laid-open No. 11-284195
Patent Document 4: Japanese patent laid-open No. 2004-214606
Patent Document 5: Japanese patent laid-open No. 2006-261636
Patent Document 6: Japanese patent laid-open No. 2005-171378
Patent Document 7: Japanese patent laid-open No. 2004-55842

DISCLOSURE OF THE INVENTION

In recent years, from the viewpoints of the improvement of yield and the improvement of productivity, the process temperature for manufacturing a display device tends to become increasingly lower. For example, the materials for the source-drain electrodes of an amorphous silicon TFT are required to have a low electric resistivity and a high heat resistance. The required specs have been, up to now, about 7 $\mu\Omega\cdot cm$ or less in terms of electric resistivity, and about 250° C. in terms of heat resistant temperature. The heat resistant temperature is determined by the maximum temperature applied on the source-drain electrodes in the manufacturing step. The maximum temperature is set as the formation temperature of an insulation film to be formed as a protective film on electrodes. Recently, the improvement of the deposition technology can provide a desirable insulation film even at a low temperature. Particularly, for the protective film on the source-drain electrodes, deposition at about 220° C. has become possible.

For this reason, the material is required to be a wiring material capable of directly coupling a drain electrode and a transparent pixel electrode, and in addition, to have a heat resistant temperature at 220° C. level, and an electric resistivity as sufficiently low as about 4.5 $\mu\Omega\cdot cm$ or less as the electric resistivity, and preferably to be also excellent in dry etching property.

However, there has not been disclosed an Al type wiring material capable of being directly connected to transparent pixel electrodes, which has both of such low electric resistivity and high heat resistance, and is preferably also excellent in dry etching property.

For example, the Al alloy film disclosed in Japanese patent laid-open No. 2004-214606 has a low electric resistivity, but has a low heat resistant temperature.

Further, even with the Al alloy film disclosed in Japanese patent laid-open No. 2006-261636, heating at 250° C. results in about 7 $\mu\Omega\cdot cm$, which cannot be said enough.

Thus, with a conventional Al alloy film of an Al—Nd alloy or the like, conceivably, when the process temperature is reduced, as shown hereinafter, precipitation and crystal growth of an intermetallic compound do not proceed sufficiently. Accordingly, a low electric resistivity cannot be obtained. The reduction of the amount of Nd added can provide a low electric resistivity even when the process temperature is reduced. However, the precipitates are small in amount, and the crystal growth proceeds. Thus, hillocks tend to be formed, so that the heat resistant temperature decreases.

Below, this point will be described in details.

The Al alloy film is generally formed by a sputtering method. However, with this method, the alloy component added in an amount of more than solubility limit in Al is present in a forced solid solution state. The electric resistivity of an Al alloy comprising an alloy element in a solid solution state is generally higher than that of pure Al. In contrast, when the Al alloy film comprising an alloy element in an amount of more than the solubility limit is heated, the alloy component precipitates as an intermetallic compound at the grain boundary. Further heating thereof causes the recrystallization of Al to proceed, so that crystal growth of Al occurs. The precipitation temperature of the intermetallic compound and the temperature of the crystal growth at this step vary according to the alloy element. However, in any case, the electric resistivity of the Al alloy film is reduced by the precipitation of the alloy component (intermetallic compound) and the crystal growth.

When the crystal growth proceeds by heating, the compressive stress in the film inside increases. However, when the crystal growth proceeds by further heating, the film finally becomes unbearable. For stress relaxation, Al diffuses into the film surface, so that hillocks (bump-like projections) occur. Alloying has a function of suppressing the diffusion of Al by the intermetallic compound which has precipitated at the grain boundary, and preventing the formation of hillocks, and enhancing the heat resistance. In the related art, by using such a phenomenon, the precipitation of the alloy component and the crystal growth are allowed to proceed, thereby to implement the compatibility between the reduction of the electric resistivity and the high heat resistance of the Al alloy film.

However, when the process temperature becomes low as described above, with a conventional alloy component, the precipitation of an intermetallic compound does not occur sufficiently. As a result, the crystal growth also ceases to proceed, so that the electric resistivity becomes less likely to be reduced.

In the foregoing description, the liquid crystal display device was typically cited and described. However, the foregoing problem is not limited to the liquid crystal display device, and is observed with amorphous silicon TFT substrates in common. Further, the problem is also observed in the case where polysilicon is used other than amorphous silicon as the semiconductor layer of the TFT.

On the other hand, as described above, the Al alloy film is also required to have, other than the foregoing property, an excellent dry etching property. However, an Al alloy thin film having all these properties has not yet been provided.

The present invention was completed in view of such circumstances. It is an object thereof to provide a technology which enables omission of a barrier metal layer, and achieves simplification without increasing the number of steps; and which not only allows direct and sure coupling of the Al alloy film with a transparent pixel electrode including a conductive oxide film, but also can implement the reduction of the electric resistivity between the transparent pixel electrodes and the excellent heat resistance even when a lower heat treatment temperature is applied to the Al alloy film for a shorter time; and which is also preferably excellent in dry etching property. Specifically, it is an object thereof to provide a TFT substrate and a display device, each capable of further reducing the electric resistivity of the Al type alloy thin film without causing defects such as hillocks even when a heat treatment for a shorter time and at a lower temperature, such as 220° C.×20 minutes, as the criteria of the electric resistivity and the heat resistance, is adopted, and adaptable to the trend for a lower processing temperature. In addition, it is an object thereof to provide a sputtering target for deposition of an Al type alloy thin film useful for manufacturing of the display device.

The Al alloy film for a display device of the present invention which was able to solve the foregoing problem is an Al alloy film for a display device to be directly connected to a conductive oxide film on a substrate. The Al alloy film comprises Ge in an amount of 0.05 to 0.5 at %, and comprises Gd and/or La in an amount of 0.05 to 0.45 at % in total. Gd and La may be each independently comprised in an amount of 0.05 to 0.45 at %, and may be comprised in an amount of 0.05 to 0.45 at % in total.

Another Al alloy film for a display device of the present invention which was able to solve the foregoing problem is an Al alloy film for a display device to be directly connected to an amorphous Si layer or a polycrystalline Si layer on a substrate. The Al alloy film comprises Ge in an amount of 0.05 to 0.5 at %, and comprises Gd and/or La in an amount of 0.05 to 0.45 at % in total. Gd and La may be each independently comprised in an amount of 0.05 to 0.45 at %, and may be comprised in an amount of 0.05 to 0.45 at % in total.

Herein, with an Al alloy film for a display device comprising Gd and/or La in an amount of 0.05 to 0.35 at % in total, the excellent dry etching property can also be attained.

It is recommended that the Al alloy film for a display device is adjusted so as to further comprise Ni in an amount of 0.05 to 0.35 at %, and to have a total content of Ge and Ni of 0.45 at % or less.

The display device of the present invention which was able to solve the foregoing problem has the Al alloy film and a thin film transistor.

Another display device of the present invention which was able to solve the foregoing problem is configured such that the Al alloy film is used for the gate electrode of a thin film transistor and the scanning line, and is directly connected to a conductive oxide film.

A still other display device of the present invention which was able to solve the foregoing problem is configured such that the Al alloy film is used for the source electrode and/or the drain electrode of a thin film transistor, and the signal line, and is directly connected to a conductive oxide film and/or an amorphous Si layer or a polycrystalline Si layer.

There is recommended a configuration in which the source electrode and/or the drain electrode of the thin film transistor, and the signal line are formed of the same material as that for the gate electrode of the thin film transistor and the scanning line.

It is preferable that the conductive oxide film is formed of a composite oxide comprising at least one selected from the group consisting of indium oxide, zinc oxide, tin oxide, and titanium oxide.

It is preferable that the electric resistivity of the Al alloy film for a display device is 4.5 μΩ·cm or less.

A sputtering target of the present invention which was able to solve the foregoing problem comprises Ge in an amount of 0.05 to 0.5 at %, and comprises Gd and/or La in an amount of 0.05 to 0.45 at % in total. Gd and La may be each independently comprised in an amount of 0.05 to 0.45 at %, and may be comprised in an amount of 0.05 to 0.45 at % in total.

The sputtering target is recommended to be adjusted so as to further comprise Ni in an amount of 0.05 to 0.35 at %, and to have a content of Ge and Ni of 0.45 at % or less in total.

In accordance with the present invention, it is possible to provide an Al alloy film for a display device configured as follows: the Al alloy film can be directly connected to the transparent pixel electrode including a conductive oxide film without a barrier metal layer interposed therebetween, and, even when a heat treatment temperature as relatively low as about 220° C. is applied thereto, sufficiently low electric resistivity and excellent heat resistance are ensured; and a display device using the same. The heat treatment temperature denotes, for example, the heat treatment temperature which is the highest temperature during the manufacturing step of a TFT (thin film transistor) array; and means, during a general manufacturing step of a display device, the heating temperature of a substrate during CVD deposition for forming various thin films, the temperature of a heat treatment furnace for thermosetting the protective film, or the like.

For example, when the Al alloy film for use in the present invention is applied to the wiring material for the source-drain electrodes, the barrier metal layer 54 shown in FIG. 2 can be omitted. Alternatively, the Al alloy film for use in the present invention is applied to the gate electrode, and the wiring material therefor, the barrier metal layers 51 and 52 shown in FIG. 2 can be omitted.

Further, by controlling the content of Gd and/or La, it is possible to have excellent dry etching property in addition to the foregoing property.

Use of the Al alloy film for a display device of the present invention can provide a display device which is excellent in productivity, and is inexpensive and is high in performances.

Figure 1:
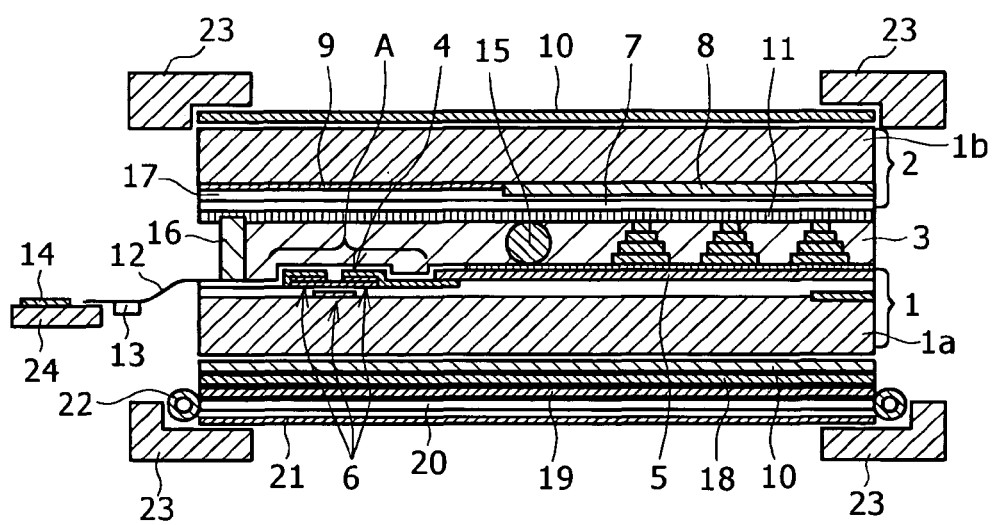
FIG. 1 is a schematic cross sectional enlarged illustrative view showing a configuration of a typical liquid crystal display to which an amorphous silicon TFT substrate is applied.

| | Description of Reference numerals and signs |
|---|---|
| 1 | TFT substrate |
| 2 | Opposing substrate |
| 3 | Liquid crystal layer |
| 4 | Thin film transistor (TFT) |
| 5 | Transparent pixel electrode |
| 6 | Wiring part |
| 7 | Common electrode |
| 8 | Color filter |
| 9 | Light shield film |
| 10a, 10b | polarizing plate |
| 11 | Alignment film |
| 12 | TAB tape |
| 13 | Driver circuit |
| 14 | Control circuit |
| 15 | Spacer |
| 16 | Sealing material |
| 17 | Protective film |
| 18 | Diffusion plate |
| 19 | Prism sheet |
| 20 | Light guide plate |
| 21 | Reflection plate |
| 22 | Backlight |
| 23 | Holding frame |

-continued

| | Description of Reference numerals and signs |
|---|---|
| 24 | Printed substrate |
| 25 | Scanning line |
| 26 | Gate electrode |
| 27 | Gate insulation film |
| 28 | Source electrode |
| 29 | Drain electrode |
| 30 | Protective film (silicon nitride film) |
| 31 | Photoresist |
| 32 | Contact hole |
| 33 | Amorphous silicon channel film (active semiconductor film) |
| 34 | Signal line (source-drain wire) |
| 51, 52, 53, 54 | Barrier metal layer |
| 55 | Non-doping hydrogenated amorphous silicon film (a-Si—H) |
| 56 | $N^+$ type hydrogenated amorphous silicon film ($n^+$ a-Si—H) |
| 61 | Chamber |
| 62 | Dielectric window |
| 63 | Antenna |
| 64 | High frequency power (antenna side) |
| 65 | Matching unit (antenna side) |
| 66 | Process gas inlet |
| 67 | Substrate (to-be-etched material) |
| 68 | Susceptor |
| 69 | Dielectric chuck |
| 70 | Color |
| 71 | Matching unit (substrate side) |
| 72 | High frequency power (substrate side) |

BEST MODE FOR CARRYING OUT THE INVENTION

The present inventors have conducted a close study in order to provide a novel wiring material which can be directly connected to a transparent pixel electrode including a conductive oxide film, and respective electrodes such as source, drain, and gate of a thin film transistor, and further, has both sufficiently low electric resistivity and excellent heat resistance even when a heat treatment temperature as relatively low as about 220° C. is applied thereto, and preferably is also excellent in dry etching property. Particularly, the present inventors conducted a continued study based on the viewpoint of still more reducing the electric resistivity and still more improving the heat resistance in the Al type alloy thin film even under the conditions of further lower temperature and shorter time than the heat treatment conditions described in the foregoing Japanese patent laid-open No. 2006-261636. As a result, they found out the following: when particularly, Ge out of the alloy components belonging to the group α described in Japanese patent laid-open No. 2006-261636 is comprised within a specific range, and Gd and/or La is used in a predetermined amount as a third component, the intended purpose can be achieved. Thus, the present invention has been completed.

In accordance with the present invention, Ge is comprised in a predetermined amount as the alloy component in the Al alloy film. Therefore, even when the heat treatment in the process after formation of the Al alloy film is at a relatively low temperature and for a short time, it is possible to control low the contact resistance between the Al alloy film and the transparent pixel electrodes, and respective electrodes of source, drain, and gate of the thin film transistor. Further, as described later, the Al alloy film comprising Ge added therein less varies in contact resistance as compared with the Al alloy film comprising Ni, Ag, Zn, and Cu included in the group a described in Japanese patent laid-open No. 2006-261636, added therein.

Further, in accordance with the present invention, Gd and/or La is comprised in a predetermined amount as a heat resistance improving element in the Al alloy film. Therefore, it is possible to ensure the excellent heat resistance such that hillocks or the like are not caused even by a heat treatment at 220° C. to 300° C. Further, proper control of the content of Gd and/or La and the content of Ni also enables to have excellent dry etching property.

Therefore, in accordance with the present invention, it is possible to provide a wiring material capable of being directly connected to the transparent pixel electrodes, which has sufficiently low electric resistivity and sufficiently high heat resistance, and preferably is also excellent in dry etching property.

The term "dry etching" in this Description means removal of an object to be etched (interlayer insulation film). In addition, the term also means that, even after contact holes reach the Al alloy film, the surface of the Al alloy film is exposed to an etching gas for the purpose of surface cleaning of the Al alloy film.

In this Description, the wording "excellent in dry etching property" means: (i) small in amount of residue formed after etching; and (ii) the etching rate ratio is high. Specifically, the one satisfying the following: (i) no residue after etching occurs; and (ii) the etching rate ratio is 0.3 or more, when the properties (i) and (ii) are evaluated with a method described in Examples described later, is referred to as "the one excellent in dry etching property". The one satisfying these properties is excellent in dry etching property, and hence close control of wiring dimensions/shape can be performed with precision.

Herein, the term "etching rate ratio" is the index of ease of etching of the Al alloy thin film by plasma irradiation. In this Description, the etching rate ratio is expressed as the ratio of the etching rate of the Al alloy film relative to the etching rate of pure Al which is favorable in etching rate (i.e., the ratio of N1/N2 where Ni denotes the etching rate of the Al alloy film, and N2 denotes the etching rate of pure Al). The dry etching treatment time is shortened with an increase in etching rate ratio, so that the productivity is enhanced.

First, a description will be given to the function of Ge for use in the Al alloy film of the present invention.

Ge is useful, particularly, for reducing the contact resistance between the Al alloy film and the transparent pixel electrodes. Specifically, Ge is added thereto in an amount within the range of 0.05 to 0.5 at %. The reason why the content of Ge is set at 0.05 at % or more is to exert a contact resistance reducing effect. The content is preferably 0.07 at % or more, and more preferably 0.1 at % or more. On the other hand, the reason why the content of Ge is set at 0.5 at % or less is to prevent the electric resistivity of the Al alloy film from becoming too high. The content in preferably 0.4 at % or less, and more preferably 0.3 at % or less.

Herein, the effect of Ge exerted on the electric resistance of the Al alloy film will be described in a little more detail.

When Ge is added to the Al alloy film, at a relatively low heat treatment temperature, a precipitate comprising Ge (Ge-comprising precipitate) or a concentrated layer comprising Ge (Ge-comprising concentrated layer) is formed at the coupling interface between the Al alloy film and the transparent pixel electrodes. For this reason, as shown in Examples described later, the electric resistivity upon a heat treatment at 220° C. for 10 minutes can be reduced to roughly 4.5 Ω·cm or less.

Further, as shown in Examples described later, when Ge is in an amount within the foregoing range, the dry etching property is also good.

Herein, the term "Ge-comprising precipitate" means a precipitate resulting from precipitation of Ge. Examples thereof may include a Ge simple substance comprised in an Al—Ge—Gd alloy or an Al—Ge—La alloy, or an Al—Ge—Gd—La alloy, or an intermetallic compound of Al, Ge, and Gd, an intermetallic compound of Al, Ge, and La, or an intermetallic compound of Al, Ge, Gd, and La.

Whereas, "Ge-comprising concentrated layer" means the layer of which the average concentration of Ge in the Ge concentrated layer is two times or more (more preferably 2.5 times or more) the average concentration of Ge in the Al—Ge—Gd alloy, the Al—Ge—La alloy, or the Al—Ge—Gd—La alloy.

Incidentally, In the Al alloy film comprising Ge, the following may occur: Ge in an amount of exceeding the solubility limit (0.1 at %) of Ge in the Al alloy film precipitates at the grain boundary of the Al alloy film by a heat treatment or the like, and a part thereof is diffused/concentrated in the surface of the Al alloy film to form a Ge concentrated layer. Such a Ge concentrated layer is also included in the "Ge-comprising concentrated layer". Whereas, for example, when etching of the contact hole is performed, a halogen compound of Ge has a lower vapor pressure than that of Al, and hence, is less likely to volatilize, and remains on the surface of the Al alloy film. This results in that the concentration of Ge at the alloy film surface layer part is higher than the concentration of Ge of an Al type alloy bulk material. Such a form is also included in the "Ge-comprising concentrated layer". Incidentally, by properly controlling the etching conditions, the concentration of Ge at the Al type alloy thin film surface layer part, and the thickness of the Ge-comprising concentrated layer are changed. At this step, some Gd or La to be used as a third component may be partially concentrated on the surface layer side. However, such a form is also included in the "Ge-comprising concentrated layer".

The thickness of the Ge-comprising concentrated layer is preferably 0.5 nm or more and 10 nm or less, and more preferably 1.0 nm or more and 5 nm or less.

Incidentally, as described below, the electric resistivity of a binary alloy of an Al—Ge alloy after having been subjected to a heat treatment at 220° C. for 10 minutes is very low.

Thus, when a third component is further added into the Al—Ge alloy, the electric resistivity tends to increase. Therefore, when only the reduction of the electric resistivity is aimed, the binary alloy of the Al—Ge alloy may be used. However, as described previously, the heat resistance becomes as low as about 150° C. Therefore, as in the present invention, when the object is to provide a wiring material having both low electric resistivity and high heat resistance, the binary alloy of the Al—Ge alloy is insufficient. Thus, as described below, a tertiary alloy of an Al—Ge—Gd alloy or an Al—Ge—La alloy, or a quaternary alloy of an Al—Ge—Gd—La alloy was to be used.

By using a tertiary alloy of an Al—Ge—Gd alloy or an Al—Ge—La alloy, or a quaternary alloy of an Al—Ge—Gd—La alloy, the heat resistance of the Al alloy film is remarkably enhanced. This can effectively prevent hillocks from being formed on the surface of the Al alloy film. In order to effectively obtain the effects of the heat resistance, the content of Gd and La is required to be 0.05 at % or more. It is preferably 0.1 at % or more. On the other hand, when the content of Gd and La is excessively increased, the electric resistivity of the Al alloy film increases. Therefore, the upper limit of the content is 0.45 at %, more preferably 0.4 at %, and further preferably 0.3 at %. These elements may be added alone, or may be used in combination of two or more thereof. When two or more elements are added, it is essential only that the total content of respective elements satisfies the foregoing range.

Incidentally, in view of the improvement of the dry etching property, the upper limit of the content of Gd and/or La is preferably set at 0.35 at %. This is due to the following: as shown in Examples described later, when the content exceeds 0.35 at %, the etching rate ratio may decrease, and in addition, residue may occur after dry etching. In the case where only the dry etching property is considered, a lower upper limit of the content of Gd and/or La is more preferable. In the case where all of the reduction of the electric resistivity, the improvement of the heat resistance, and the improvement of the dry etching property of the Al alloy film are desired to be achieved, the content of Gd and/or La is more preferably set at roughly 0.1 at % or more and 0.30 at % or less.

Further, when Ni is added to a tertiary alloy of an Al—Ge—Gd alloy or an Al—Ge—La alloy, or a quaternary alloy of an Al—Ge—Gd—La alloy, it is possible to reduce the contact resistance between the Al alloy film and the transparent pixel electrodes, or the Al alloy film and respective electrodes of source/drain/gate. In order to exert such effects, Ni is preferably comprised in an amount of 0.05 at % or more. The content is more preferably 0.07 at % or more, and further preferably 0.1 at % or more. On the other hand, when the content of Ni becomes too large, the electric resistivity of the Al alloy film increases. Therefore, the upper limit of the Ni content is preferably 0.35 at %, more preferably 0.3 at %, further preferably 0.25 at %, and furthermore preferably 0.20 at %.

Whereas, when the Ni content is within the foregoing range, a residue after etching does not occur, resulting in a high etching rate ratio. Accordingly, an excellent dry etching property is exerted (see Examples described later).

Whereas, when each of a tertiary alloy of Al—Ge—Gd alloy or Al—Ge—La alloy, or a quaternary alloy of Al—Ge—Gd—La alloy each comprises Ni, the content of Ge and Ni is preferably within the range of 0.1 to 0.45 at % in total. When the total content of Ge and Ni is less than 0.1 at %, the contact electric resistance between the Al alloy film and the transparent pixel electrode cannot be controlled low. Thus, the function of Ge and Ni cannot be effectively exerted. On the other hand, even when each content of Ge and Ni alone satisfies the foregoing range, a total content of Ge and Ni of more than 0.6 at % results in the reduction of the etching rate ratio (see Examples described later). The upper limit of the total content of Ge and Ni is more preferably 0.35 at %, and further preferably 0.30 at % or less.

Below, with reference to the accompanying drawings, a description will be given to preferred embodiments of a TFT substrate in accordance with the present invention. Below, a liquid crystal display device including an amorphous silicon TFT substrate or a polysilicon TFT substrate will be typically taken, and described. However, the present invention is not limited thereto. Appropriate modification can be made within the scope adaptable to the gists described above and below, and executed. All of these are included in the technical scope of the present invention. It has been experimentally confirmed that the Al type alloy film for use in the present invention can also similarly be applied to, for example, a reflection electrode of a reflection type liquid crystal display device, or the like, and a TAB connection electrode to be used for inputting and outputting of signals to outside.

(Embodiment 1) By reference to FIG. 3, an embodiment of an amorphous silicon TFT substrate will be described in details. FIG. 3 is a schematic cross sectional illustrative view for illustrating a preferred embodiment of a bottom gate type TFT substrate in accordance with the present invention. In FIG. 3, the same reference numerals as those in FIG. 2 described above, indicating a conventional TFT substrate are given.

Figure 2:
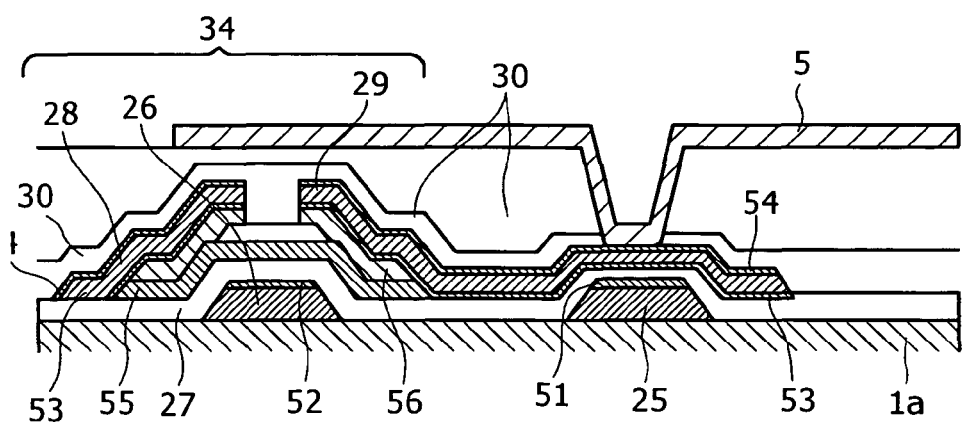
FIG. 2 is a schematic cross sectional illustrative view showing a configuration of a conventional typical amorphous silicon TFT substrate.
Figure 3:
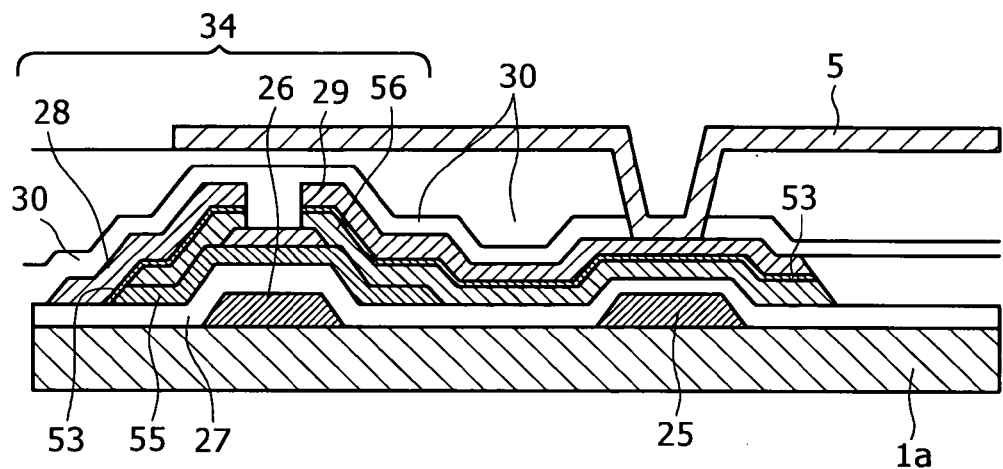
FIG. 3 is a schematic cross sectional illustrative view showing a configuration of a TFT substrate in accordance with a first embodiment of the present invention.
Figure 4:
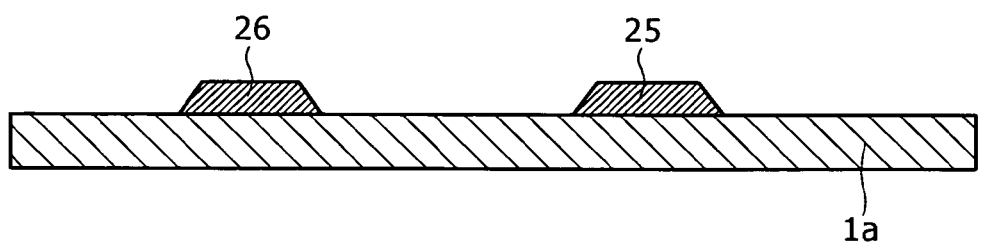
FIG. 4 is an illustrative view showing step by step one example of the manufacturing step of the TFT substrate shown in FIG. 3.

Apparent from the comparison between FIG. 2 and FIG. 3, in the conventional TFT substrate, as shown in FIG. 2, on a scanning line 25, on a gate electrode 26, and on or under a source-drain wire 34, barrier metal layers 51, 52, 54, and 53 are formed, respectively. In contrast, in the TFT substrate of this embodiment, the barrier metal layers 51, 52, and 54 can be omitted. Namely, in accordance with this embodiment, the wiring material for use in a source-drain electrode 29 of the TFT can be directly connected to a transparent pixel electrode 5 without allowing a barrier metal layer to be interposed therebetween as in the related art. This can also implement favorable TFT property comparable to, or greater than those of the conventional TFT substrate (see Examples described later).

Incidentally, the wiring material for use in the present invention is applied to the wiring material for the source-drain electrodes and the gate electrodes as in this embodiment. For example, when the wiring material of the present invention is applied to the wiring material for the gate electrodes, the barrier metal layers 51 and 52 can be omitted. It has been confirmed that favorable TFT property comparable to, or greater than those of the conventional TFT substrate can also be implemented in these embodiments.

Then, with reference to FIGS. 4 to 11, a description will be given to one example of a manufacturing method of an amorphous silicon TFT substrate in accordance with the present invention shown in FIG. 3. Herein, as the material for use in the source-drain electrodes and the wire thereof, an Al-0.2 at % Ge-0.2 at % Gd alloy is used. Whereas, as the material for use in the gate electrodes and a wire thereof, an Al-0.2 at % Ge-0.35 at % Gd alloy is used. The thin film transistor is an amorphous silicon TFT using a hydrogenated amorphous silicon as the semiconductor layer. In FIGS. 4 through 11, the same reference numerals and signs as those in FIG. 3 are given.

First, on a glass substrate (transparent substrate) 1a, an Al-0.2 at % Ge-0.35 at % Gd alloy is deposited with a thickness of about 200 nm by using a sputtering method. The deposition temperature of sputtering was set at 150° C. By patterning this film, the gate electrode 26 and the scanning line 25 are formed (see FIG. 4). At this step, in FIG. 5 described later, the outer edge of the lamination thin film is desirably etched in the form of an about 30° to 40° taper so as to improve the coverage of the gate insulation film 27.

Figure 5:
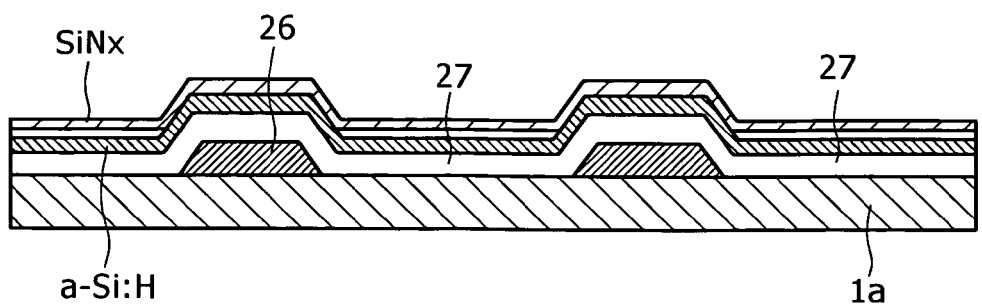
FIG. 5 is an illustrative view showing step by step one example of the manufacturing step of the TFT substrate shown in FIG. 3.

Then, as shown in FIG. 5, with a method such as a plasma CVD method, a gate insulation film 27 is formed of a silicon oxide film (SiOx) with a thickness of about 300 nm. The deposition temperature of the plasma CVD method was set at about 350° C. Subsequently, with a method such as a plasma CVD method, on the gate insulation film 27, hydrogenated amorphous silicon film (a-Si—H) 55 with a thickness of about 50 nm and a silicon nitride film (SiNx) with a thickness of about 300 nm are deposited.

Figure 6:
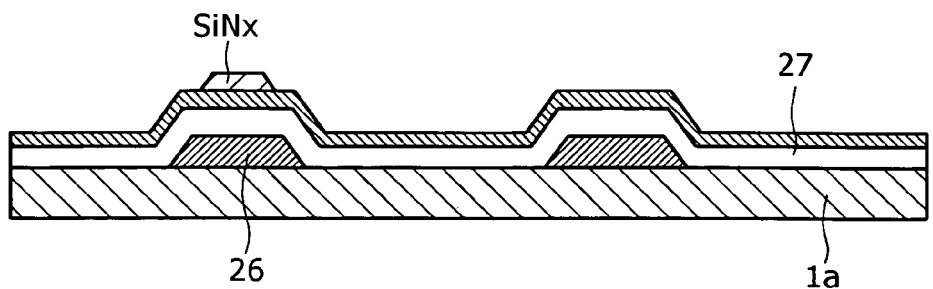
FIG. 6 is an illustrative view showing step by step one example of the manufacturing step of the TFT substrate shown in FIG. 3.
Figure 7:
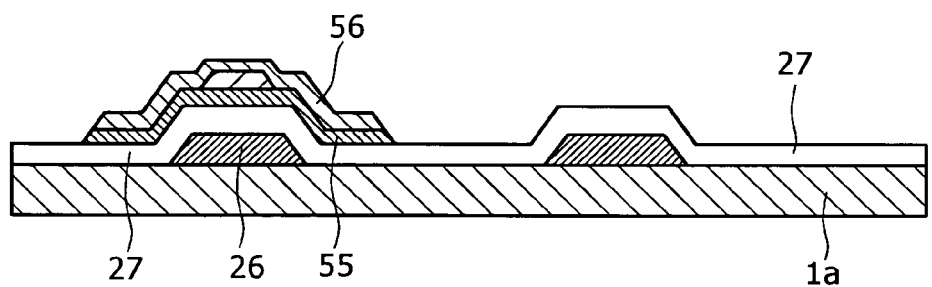
FIG. 7 is an illustrative view showing step by step one example of the manufacturing step of the TFT substrate shown in FIG. 3.

Subsequently, by back side light exposure with the gate electrode 26 as a mask, as shown in FIG. 6, the silicon nitride film (SiNx) is patterned to form a channel protective film. Further, thereon, a phosphorus-doped N$^+$ type hydrogenated amorphous silicon film (n$^+$ a-Si—H) 56 is deposited with a thickness of about 50 nm. Then, as shown in FIG. 7, the hydrogenated amorphous silicon film (a-Si—H) 55 and the n$^+$ type hydrogenated amorphous silicon film (n$^+$ a-Si—H) 56 are patterned.

Figure 8:
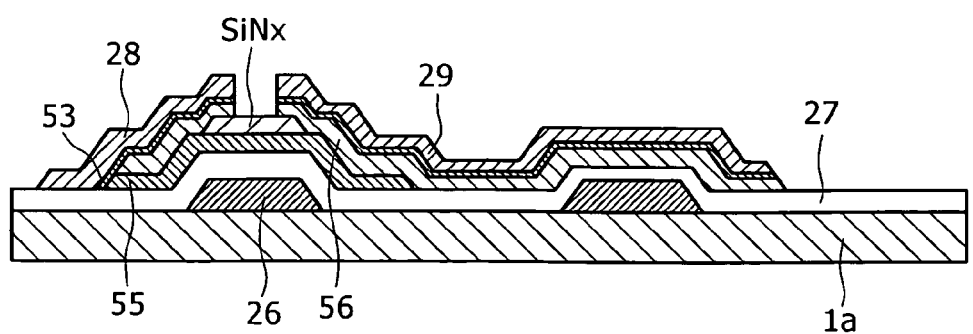
FIG. 8 is an illustrative view showing step by step one example of the manufacturing step of the TFT substrate shown in FIG. 3.

Then, thereon, with a sputtering method, a MO film 53 with a thickness of about 50 nm, an Al-0.2 at % Ge-0.2 at % Gd alloy films 28 and 29 with a thickness of about 300 nm, and a MO film (not shown) with a thickness of about 50 nm are sequentially stacked. The deposition temperature of sputtering was set at 150° C. Then, by performing patterning as shown in FIG. 8, the source electrode 28 integral with the signal line, and the drain electrode 29 to be directly connected to the pixel electrode 5 are formed. Further, with the source electrode 28 and the drain electrode 29 as a mask, the $n^+$ type hydrogenated amorphous silicon film ($n^+$ a-Si—H) 56 on the channel protective film (SiNx) is dry etched, and is removed.

Figure 9:
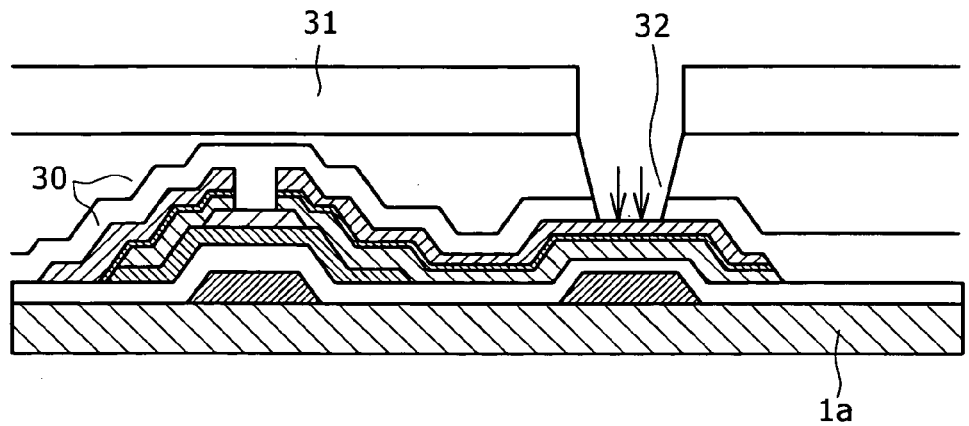
FIG. 9 is an illustrative view showing step by step one example of the manufacturing step of the TFT substrate shown in FIG. 3.

Then, as shown in FIG. 9, by means of, for example, a plasma CVD device, a silicon nitride film 30 with a thickness of about 300 nm is deposited to form a protective film. The deposition temperature at this step is, for example, about 220° C. for execution. Then, on the silicon nitride film 30, a photoresist layer 31 is formed, and then, the silicon nitride film 30 is patterned. Thus, contact holes 32 are formed in the silicon nitride film 30 by, for example, dry etching. Simultaneously, a contact hole (not shown) is formed at a portion for connection with the TAB on the gate electrode at the panel end.

Figure 10:
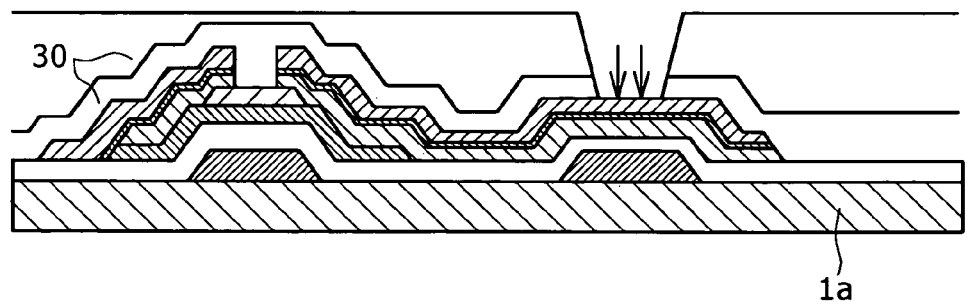
FIG. 10 is an illustrative view showing step by step one example of the manufacturing step of the TFT substrate shown in FIG. 3.
Figure 11:
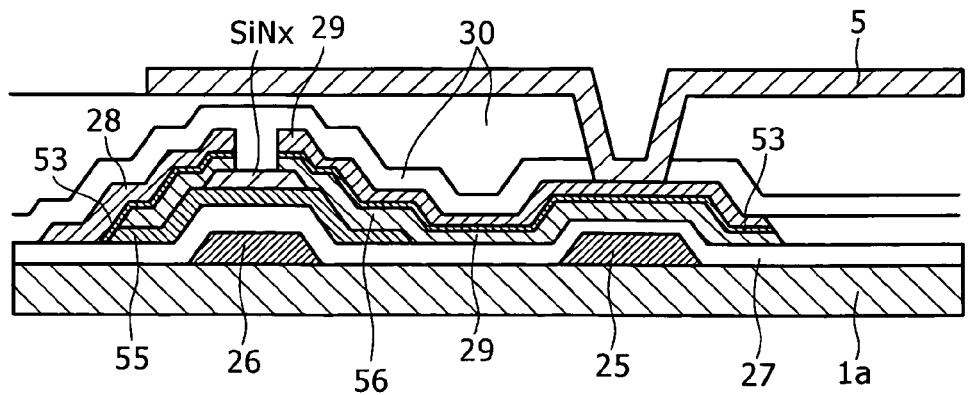
FIG. 11 is an illustrative view showing step by step one example of the manufacturing step of the TFT substrate shown in FIG. 3.

Then, after undergoing an ashing step by, for example, an oxygen plasma, as shown in FIG. 10, with a releasing solution of, for example, amine type, the photoresist layer 31 is released. Finally, within a range of, for example, the storage time (about 8 hours), as shown in FIG. 11, an ITO film with a thickness of, for example, about 40 nm is deposited, and patterned by wet etching, thereby to form the transparent pixel electrode 5. Simultaneously, the ITO film is patterned for bonding with the TAB at the connection part with the TAB of the gate electrode at the panel end, resulting in the completion of a TFT array substrate 1.

In the TFT substrate thus manufactured, the drain electrode 29 and the transparent pixel electrode 5 are in direct contact with each other, and the gate electrode 26 and the ITO film for TAB connection are also in direct contact with each other.

In the foregoing description, as the transparent pixel electrode 5, the ITO (indium tin oxide) film was used. However, a composite oxide comprising at least one of indium oxide, zinc oxide, tin oxide, and titanium oxide may also be used. For example, an IZO film (InOx—ZnOx type conductive oxide film) can also be used. Whereas, as the active semiconductor layer, polysilicon may be used in place of amorphous silicon (see Embodiment 2 described later).

By using the TFT substrate thus obtained, and with, for example, the following method, the liquid crystal display device shown in FIG. 1 is completed.

First, the surface of the TFT substrate 1 manufactured in the foregoing manner is coated with, for example, polyimide, and is dried, and then, is subjected to a rubbing treatment to form an alignment film.

On the other hand, for the opposing substrate 2, for example, chromium (Cr) is patterned in a matrix on the glass substrate, thereby to form a light shield film 9. Then, in the gaps in the light shield film 9, red, green, and blue color filters 8 made of a resin are formed. On the light shield film 9 and the color filters 8, a transparent conductive film such as an ITO film is disposed as a common electrode 7, thereby to form the opposing electrode. Then, the uppermost layer of the opposing electrode is coated with, for example, polyimide, and dried, and then subjected to a rubbing treatment, thereby to form an alignment film 11.

Then, TFT substrate 1 and the side of the opposing substrate 2 on which the alignment film 11 is formed are disposed so as to face each other. Thus, with a sealing material 16 made of a resin or the like, two sheets of the TFT substrate 1 and the opposing substrate 2 are bonded together except for the sealing port of a liquid crystal. At this step, a spacer 15 is interposed between the TFT substrate 1 and the opposing substrate 2. By this or other configurations, the gap between the two substrates is kept generally constant.

The void cell thus obtainable is placed in vacuum, and is gradually returned to atmospheric pressure with the sealing port immersed in liquid crystal. As a result, a liquid crystal material comprising liquid crystal molecules is injected into the void cell, thereby to form a liquid crystal layer. Thus, the sealing port is sealed. Finally, onto the outer opposite sides of the void cell, polarizing plates 10 are bonded, thereby to complete the liquid crystal display.

Then, as shown in FIG. 1, a driver circuit 13 for driving the liquid crystal display device is electrically connected to the liquid crystal display, and is disposed on the side part or the back side part of the liquid crystal display. Then, the liquid crystal display is held by a holding frame 23 including an opening serving as the display side of the liquid crystal display, a backlight 22 serving as a surface light source, a light guide plate 20, and the holding frame 23, resulting in the completion of the liquid crystal display device.

(Embodiment 2) With reference to FIG. 12, an embodiment of the polysilicon TFT substrate will be described in details.

Figure 12:
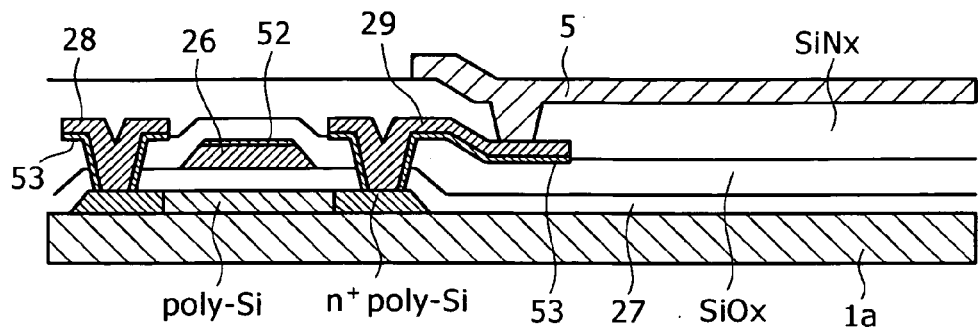
FIG. 12 is a schematic cross sectional illustrative view showing a configuration of a TFT substrate in accordance with a second embodiment of the present invention.

FIG. 12 is a schematic cross sectional illustrative view for illustrating a preferred embodiment of a top gate type TFT substrate in accordance with the present invention. In FIG. 12, the same reference numerals as those in FIG. 2 described above, indicating a conventional TFT substrate are given.

This embodiment is mainly different from Embodiment 1 described above in that polysilicon is used in place of amorphous silicon as the active semiconductor layer, in that a TFT substrate of not a bottom gate type but a top gate type is used, and in that the Al-0.2 at % Ge-0.2 at % Gd alloy satisfying the requirements of the present invention is used not as the wiring material for the source-drain electrodes and the gate electrodes, but as the wiring material for the source-drain electrodes. Minutely, the polysilicon TFT substrate of this embodiment shown in FIG. 12 is different from the amorphous silicon TFT substrate shown in FIG. 3 described above in that the active semiconductor film is formed of a polysilicon film (poly-Si) not doped with phosphorus, and a polysilicon film ($n^+$ poly-Si) ion-implanted with phosphorus or arsenic (As). Whereas, the signal line is formed in such a manner as to cross with the scanning line via the interlayer insulation film (SiOx).

In accordance with this embodiment, the barrier metal layer 54 can be omitted. Namely, the following have been experimentally confirmed: the wiring material for use in the source-drain electrode 29 of the TFT can be directly connected to the transparent pixel electrode 5 without allowing a barrier metal layer to be interposed therebetween as in the related art. This can also implement favorable TFT property comparable to, or greater than those of the conventional TFT substrate.

In this embodiment, when the alloy is applied to the wiring material for the gate electrodes, the barrier metal layers 51 and 52 can be omitted. Further, when the alloy is applied to the wiring material for the source-drain electrodes and the gate electrodes, the barrier metal layers 51, 52, and 54 can be omitted. It has been confirmed that also with these, favorable TFT property comparable to, or greater than those of the conventional TFT substrate can be implemented.

Then, with reference to FIGS. 13 through 19, a description will be given to one example of the manufacturing method of the polysilicon TFT substrate in accordance with the present invention shown in FIG. 12. Herein, as the source-drain electrodes, and the wiring material therefor, an Al-0.2 at % Ge-0.2 at % Gd alloy is used. The thin film transistor is a polysilicon TFT using a polysilicon film (poly-Si) as the semiconductor layer. In FIGS. 13 through 19, the same reference numeral and signs as those in FIG. 12 are given.

Figure 13:
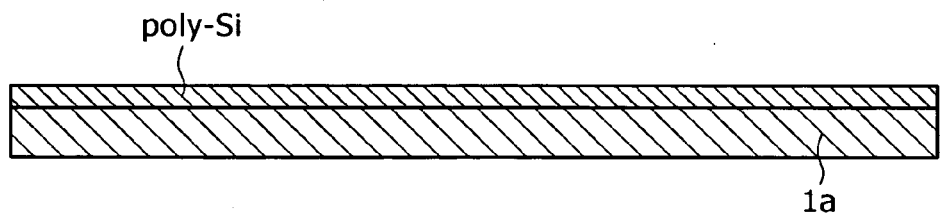
FIG. 13 is an illustrative view showing step by step one example of the manufacturing step of the TFT substrate shown in FIG. 12.

First, on the glass substrate $1a$, with, for example, a plasma CVD method, a silicon nitride film (SiNx) with a thickness of about 50 nm, a silicon oxide film (SiOx) with a thickness of about 100 nm, and a hydrogenated amorphous silicon film (a-Si—H) with a thickness of about 50 nm are deposited at a substrate temperature of about 300° C. Then, in order to convert the hydrogenated amorphous silicon film (a-Si—H) into polysilicon, a heat treatment (at about 470° C. and for about 1 hour) and laser annealing are performed. A dehydrogenation treatment is performed. Then, by means of, for example, an excimer laser annealing device, a laser light with an energy of about 230 mJ/cm$^2$ is applied to the hydrogenated amorphous silicon film (a-Si—H). This results in a polysilicon film (poly-Si) with a thickness of about 0.3 μm (FIG. 13).

Figure 14:
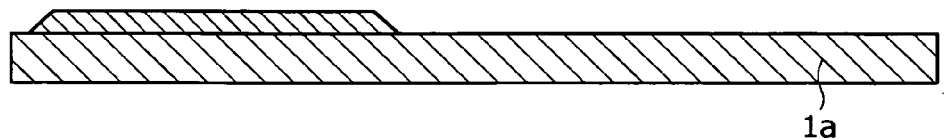
FIG. 14 is an illustrative view showing step by step one example of the manufacturing step of the TFT substrate shown in FIG. 12.
Figure 15:
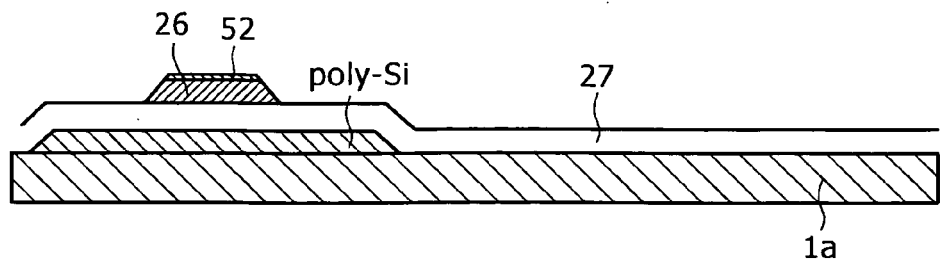
FIG. 15 is an illustrative view showing step by step one example of the manufacturing step of the TFT substrate shown in FIG. 12.

Then, as shown in FIG. 14, the polysilicon film (poly-Si) is patterned by plasma etching or the like. Then, as shown in FIG. 15, a silicon oxide film (SiOx) with a thickness of about 100 nm is deposited to form a gate insulation film 27. On the gate insulation film 27, by sputtering or the like, an Al-2 at % Nd alloy thin film with a thickness of about 200 nm, and a MO thin film 52 with a thickness of about 50 nm are stacked, followed by patterning with a method of plasma etching or the like. This results in the formation of the gate electrode 26 integral with the scanning line.

Figure 16:
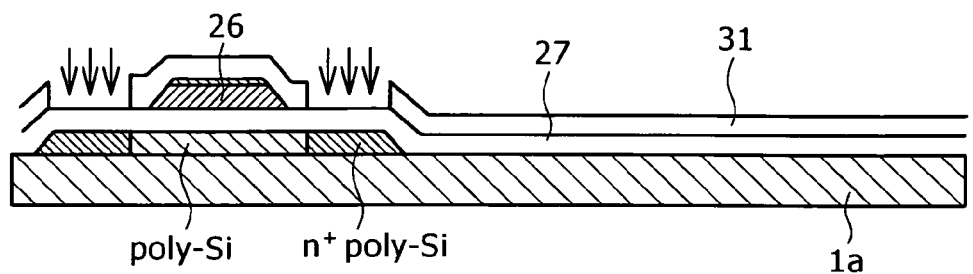
FIG. 16 is an illustrative view showing step by step one example of the manufacturing step of the TFT substrate shown in FIG. 12.

Subsequently, as shown in FIG. 16, a mask is formed of a photoresist 31. Thus, by means of, for example, an ion implantation device, for example, phosphorus is doped at about $1 \times 10^{15}$ atoms/cm$^2$ at about 50 keV, thereby to form an n$^+$ type polysilicon film (n$^+$ poly-Si) in a part of the polysilicon film (poly-Si). Then, the photoresist 31 is released, and the film is subjected to a heat treatment at, for example, about 500° C., thereby to diffuse phosphorus.

Figure 17:
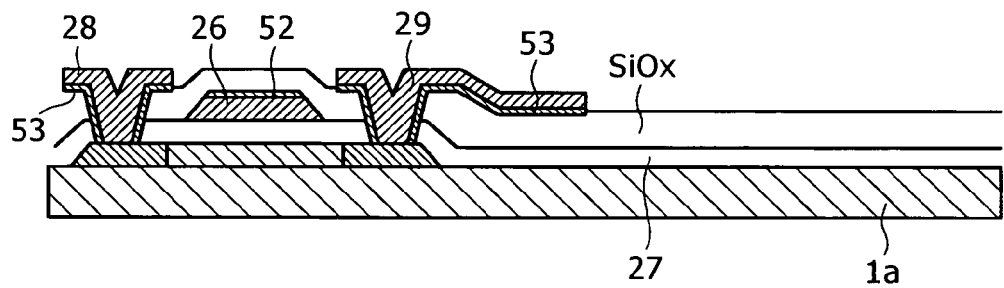
FIG. 17 is an illustrative view showing step by step one example of the manufacturing step of the TFT substrate shown in FIG. 12.

Then, as shown in FIG. 17, by means of, for example, a plasma CVD device, a silicon oxide film (SiOx) with a thickness of about 500 nm is deposited at a substrate temperature of about 250° C., thereby to form an interlayer insulation film. Then, similarly, by the use of a mask resulting from patterning with a photoresist, the silicon oxide film of the interlayer insulation film (SiOx) and the gate insulation film 27 are dry etched, thereby to form contact holes. By sputtering, a MO film 53 with a thickness of about 50 nm and an Al-0.2 at % Ge-0.2 at % Gd alloy thin film with a thickness of about 450 nm are deposited, followed by patterning. This results in the formation of a source electrode 28 and a drain electrode 29 integral with the signal line. As a result, the source electrode 28 and the drain electrode 29 are respectively brought in contact with the n$^+$ type polysilicon film (n$^+$ poly-Si) via their respective contact holes.

Figure 18:
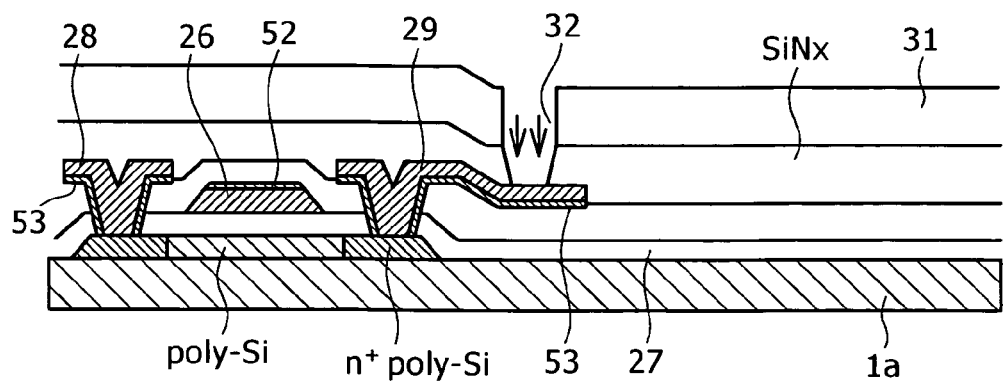
FIG. 18 is an illustrative view showing step by step one example of the manufacturing step of the TFT substrate shown in FIG. 12.

Then, as shown in FIG. 18, by means of a plasma CVD device, or the like, a silicon nitride film (SiNx) with a thickness of about 500 nm is deposited at a substrate temperature of about 220° C., thereby to form an interlayer insulation film. On the interlayer insulation film, a photoresist layer 31 is formed, and then, the silicon nitride film (SiNx) is patterned. Thus, by, for example, dry etching, a contact hole 32 is formed in the silicon nitride film (SiNx).

Figure 19:
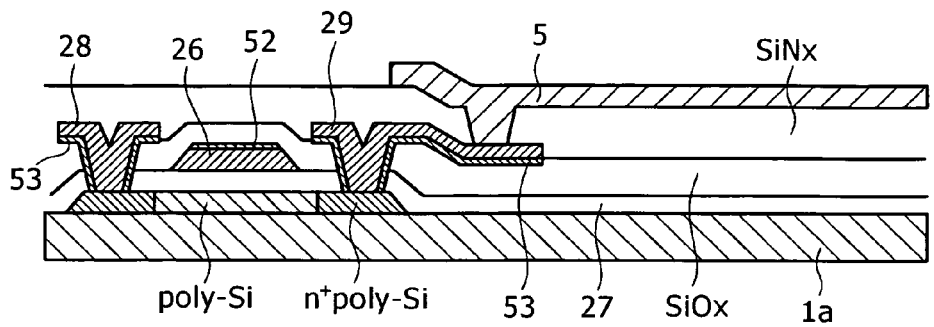
FIG. 19 is an illustrative view showing step by step one example of the manufacturing step of the TFT substrate shown in FIG. 12.

Then, as shown in FIG. 19, after undergoing, for example, an ashing step with an oxygen plasma, as with Embodiment 1 described above, by the use of an amine type release solution, or the like, the photoresist is released. Then, an ITO film is deposited, and patterning by wet etching is performed, thereby to form a pixel electrode 5.

In the polysilicon TFT substrate manufactured in this manner, the drain electrode 29 is in direct contact with the transparent pixel electrode 5. At the interface between the Al-0.2 at % Ge-0.2 at % Gd alloy thin film forming the drain electrode 29 and the pixel electrode 5, a Ge concentrated layer is formed. Thus, the contact resistance is reduced, and Ge diffuses, and precipitates in the form of a simple substance. This promotes recrystallization of Al, so that the electric resistivity of the Al alloy film itself is also largely reduced.

Then, in order to stabilize the property of the transistor, a heat treatment is performed, for example, at about 220° C. for about 1 hour, so that a polysilicon TFT array substrate is completed.

With a TFT substrate in accordance with the second embodiment, and a liquid crystal display device including the TFT substrate, the same effects as those with the TFT substrate in accordance with the first embodiment described above can be obtained. Further, the Al alloy in the second embodiment can also be used as the reflection electrode of the reflection type liquid crystal.

By the use of the TFT array substrate obtained in this manner, the liquid crystal display device is completed in the same manner as with the TFT substrate of Embodiment 1 described above.

As described above, the Al alloy film of the present invention is also excellent in dry etching property. Below, the dry etching step will be described.

In the dry etching step, generally, on the substrate mounted in a vacuum container, a raw material gas comprising a halogen gas such as Cl$_2$ is made into a plasma by a high frequency power. On the other hand, the susceptor mounting the substrate (to-be-etched material) thereon is applied with another high frequency power, so that ions in the plasma are drawn onto the substrate. Thus, there is performed anisotropic patterning by the ion assist reaction with the reactive plasma.

For example, when a Cl gas which is typical as the etching gas is used, the Cl$_2$ gas is dissociated by the plasma to generate Cl radicals. The Cl radicals are high in reactivity, are adsorbed on the Al alloy thin film which is to-be-etched object, and forms a chloride on the Al alloy thin film surface. The substrate with the Al alloy thin film formed thereon is applied with a high frequency bias. Accordingly, the ions in the plasma are accelerated, and are made incident upon the Al alloy thin film surface. By this ion bombard effect, the chloride is caused to evaporate, and is exhausted out of the vacuum container including the substrate mounted therein.

For performing dry etching with efficiency, the vapor pressure of the resulting chloride is preferably relatively high. When the vapor pressure is high, the chloride can be evaporated by the physical assist of the surface temperature of the Al alloy thin film and ion bombard. In contrast, when the vapor pressure of the chloride is low, the chloride remains formed on the surface, and remains without evaporation. Accordingly, an etching residue (the remainder occurring during dry etching) occurs.

Figure 25:
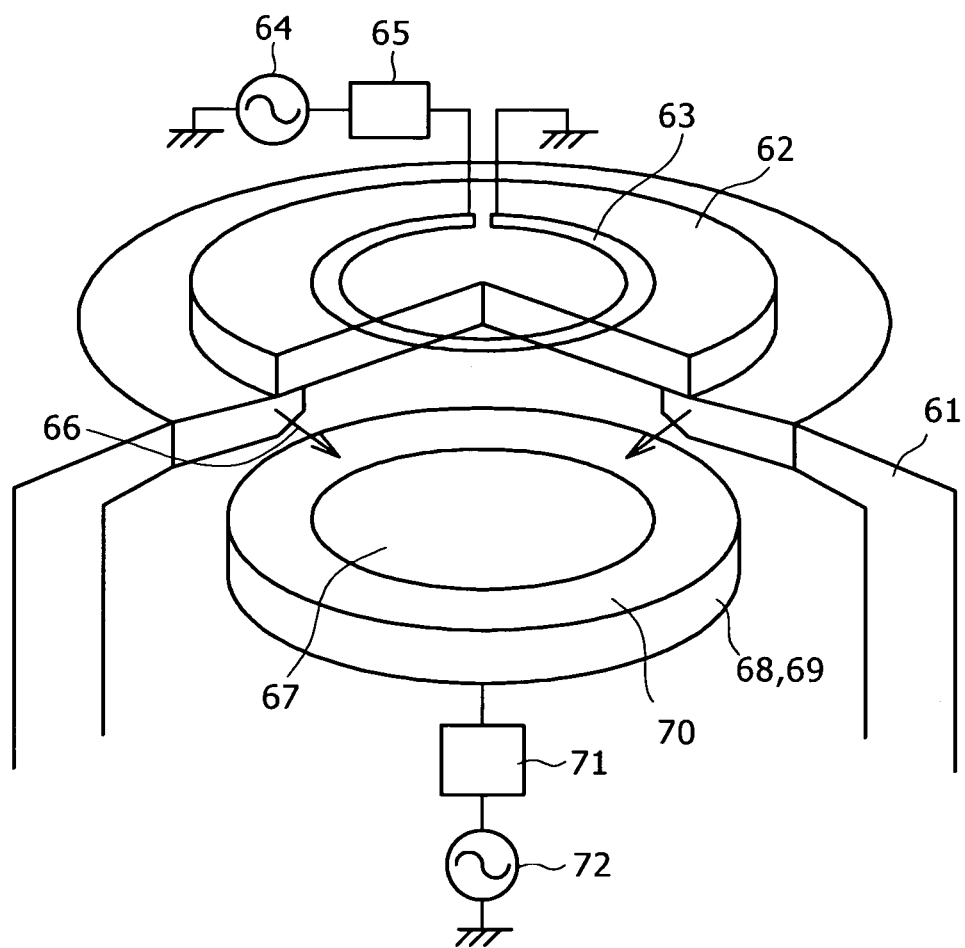
FIG. 25 is a schematic view of a device for dry etching used in Examples.

The present invention does not limit the method of a dry etching treatment, a device for use in the dry etching treatment, and the like. For example, by means of a general-purpose dry etching device as shown in FIG. 25, a general dry etching step can be performed. In Examples described later, an ICP (induction coupling plasma) type dry etching device shown in FIG. 25 was used.

Below, a description will be given to a typical dry etching treatment using the dry etching device of FIG. 25, which should not be construed as limiting in any way.

In the device of FIG. 25, at the upper part of a chamber 61, there is a dielectric window 62. On the dielectric window 62, a one-turn antenna 63 is mounted. The plasma generation device of FIG. 25 is for the one referred to as a so-called TCP (Transfer Coupled Plasma) for which the dielectric window 62 is of a flat plate type. To the antenna 63, a 13.56-MHz high frequency power 64 is introduced via a matching unit 65.

In the chamber 61, there is a process gas inlet 66, through which an etching gas including a halogen gas such as $Cl_2$ is introduced. The substrate (to-be-etched material) 67 is mounted on a susceptor 68. The susceptor 68 serves as an electrostatic chuck 69, which is configured to be capable of chucking with an electrostatic force by electric charges flowed from the plasma to the substrate. At the periphery of the susceptor 68, a member referred to as a collar 70 of quartz glass is mounted.

The halogen gas introduced into the chamber 61 is rendered in an excited state, and is converted into a plasma by a dielectric magnetic field caused by applying a high frequency power to the antenna 63 situated on the dielectric window 62.

Further, to the susceptor 68, a 400-kHz high frequency power 72 is introduced via the matching unit 71. Thus, a high frequency bias 67 is applied to the substrate (to-be-etched material) 67 mounted on the susceptor 68. By this high frequency bias, the ions in the plasma are drawn with anisotropy to the substrate, which enables anisotropic etching such as perpendicular etching.

As the etching gases (process gases) for use in the dry etching step, typically, mention may be made of a halogen gas, a boride of a halogen gas, and a mixed gas of inert gases. The composition of the mixed gas is not limited thereto. For example, further, hydrogen bromide, carbon tetrafluoride, or the like may be added thereto.

The flow rate ratio of the mixed gas has no particular restriction. However, for example, when a mixed gas of Ar, $Cl_2$, and $BCl_3$ is used, the flow rate ratio is preferably adjusted to roughly Ar:$Cl_2$:$BCl_3$=around 300 sccm:120 sccm:60 sccm.

In the present invention, dry etching can be used in all the steps of etching of the Al alloy thin film and the Si semiconductor layer, and forming contact holes. This can enhance the productivity. However, the present invention should not be construed as being limited thereto at all. For example, the following is also acceptable: immediately before the bottom of the contact hole reaches the Al alloy film, wet etching is performed, and at the final stage of the contact hole formation step, the process is switched to dry etching. By performing most of the contact hole formation step through wet etching, it is possible to process a plurality of TFT substrates in one step. However, when dry etching is performed in all the steps of contact hole formation, the productivity can be enhanced.

EXAMPLES

Below, by way of examples, the present invention will be more specifically described. However, the present invention is not naturally limited by the following examples. Appropriate modification can be made within the scope adaptable to the gists described above and below, and executed. All of these are included in the technical scope of the present invention.

As for the Al alloy films with various alloy compositions shown in Tables 1, 2, and 3, in the following manner, the electric resistivity of each Al alloy film itself, and the contact resistivity when each Al alloy film is directly connected to the transparent pixel electrode, or the amorphous Si layer, or the polycrystalline Si layer were measured, and the heat resistance when the Al alloy film has been heated was examined.

The various properties of the Al alloy film were measured under the following conditions:

(1) Configuration of transparent pixel electrode: indium tin oxide (ITO) prepared by adding 10 mass % tin oxide to indium oxide, or indium zinc oxide (IZO) prepared by adding 10 mass % zinc oxide to indium oxide (2) Conditions for formation of Al alloy film:

Atmosphere gas=Argon, Pressure=3 mTorr, Thickness=200 nm (3) Content of each alloy element in Al alloy film:

The content of each alloy element in various Al alloys subjected to experiments was determined by an ICP spectrometry (Inductively coupled plasma spectrometry) method.

Experimental Example 1

Figure 20:
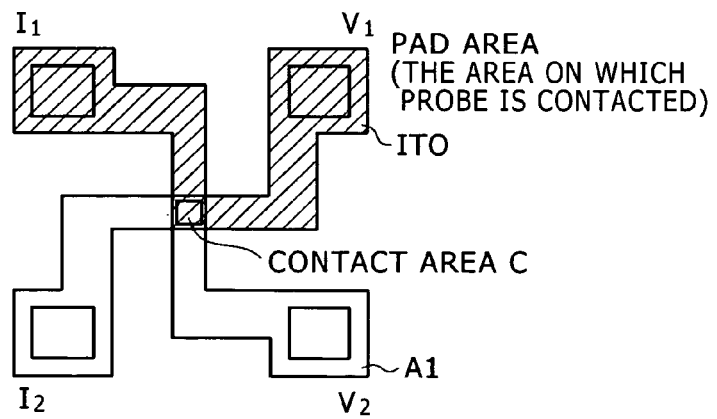
FIG. 20 is a view showing the Kelvin pattern (TEG pattern) used for the measurement of the contact resistivity (coupling resistivity) between the Al alloy film and the transparent conductive film.

As the Al alloy films, 5 kinds of samples of Al-0.3 at % α-0.35 Gd at % (α=Ni, Ge, Ag, Zn, and Cu) were prepared. Each of them was measured for the contact resistivity with the ITO film. The measurement method of the contact resistance was as follows. A Kelvin pattern (contact hole size: 10 μm square) shown in FIG. 20 was manufactured, and the four-terminal measurement (a method in which an electric current is caused to flow through the ITO-Al alloy or the IZO-Al alloy, and at another terminal, the voltage drop across the ITO-Al alloy or the IZO-Al alloy is measured) was performed. Specifically, a current I is caused to flow across $I_1$-$I_2$ of FIG. 20, and the voltage V across $V_1$-$V_2$ was monitored, thereby to determine the contact resistance R of the contact part C as [R=$(V_1-V_2)/I_2$].

Figure 21:
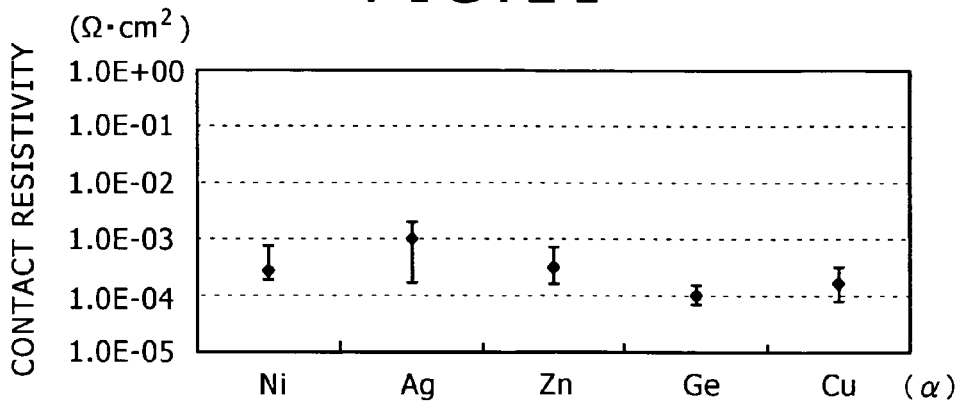
FIG. 21 is a view showing the contact resistivity between the Al alloy film and the transparent conductive film.

FIG. 21 shows the results when ITO was used as the transparent pixel electrode. The same tendency as that in FIG. 21 was also observed when IZO was used in place of ITO. FIG. 21 indicates that the contact resistivity is lowest when α=Ge. Further, it is indicated that the Ge-added Al alloy film shows the least variations in contact resistivity, and is excellent in stability (in FIG. 21, the contact resistivity is indicated with a mark ♦, and bar-like marks respectively shown on the upper side and on the lower side of the mark ♦ represent error bars).

Experimental Example 2

As the Al alloy films, ten kinds of samples of Al-0.1 at % Ge-β at % X (X=Nd, Gd, La, Dy, and Y, and for β, see Table 1) were prepared. The heat resistance of each Al alloy film was measured. The measurement method will be described. Under the conditions shown in (2), on the glass substrate, only the Al alloy film was formed. Then, a 10-μm width line-and-space pattern was formed, and the sample surface was observed by an optical microscope while being gradually heated at a rate of 50° C./min in an inert gas atmosphere. Then, the temperature at the point when the formation of hillocks had been observed (which is hereinafter referred to as a "hillock formation temperature") was recorded. The average value of five measurements of the hillock formation temperature is shown in Table 1.

TABLE 1

| Sample No. | Composition of Al alloy film Al—Ge—(X) | Ge (at %) | X (at %) | Hillock formation temperature [° C.] |
|---|---|---|---|---|
| 1 | Al—Ge—Y | 0.1 | 0.10 | 170 |
| 2 |  | 0.1 | 0.50 | 430 |
| 3 | Al—Ge—Nd | 0.1 | 0.12 | 270 |
| 4 |  | 0.1 | 0.50 | 430 |
| 5 | Al—Ge—La | 0.1 | 0.10 | 320 |
| 6 |  | 0.1 | 0.50 | 430 |

TABLE 1-continued

| Sample No. | Composition of Al alloy film | | | Hillock formation temperature |
|---|---|---|---|---|
| | Al—Ge—(X) | Ge (at %) | X (at %) | [° C.] |
| 7 | Al—Ge—Dy | 0.1 | 0.09 | 310 |
| 8 | | 0.1 | 0.50 | 460 |
| 9 | Al—Ge—Gd | 0.1 | 0.08 | 340 |
| 10 | | 0.1 | 0.50 | 430 |

Table 1 apparently indicates the following: in the case of any additional element (X), the samples show roughly the same hillock formation temperatures of about 430° C. to 460° C. in the composition region of about 0.5 at %. In contrast, in the addition composition region as low as about 0.1 at %, a difference is observed in hillock formation temperature, and the effect of heat resistance improvement decreases in the order of Gd and La.

Experimental Example 3

Figure 22:
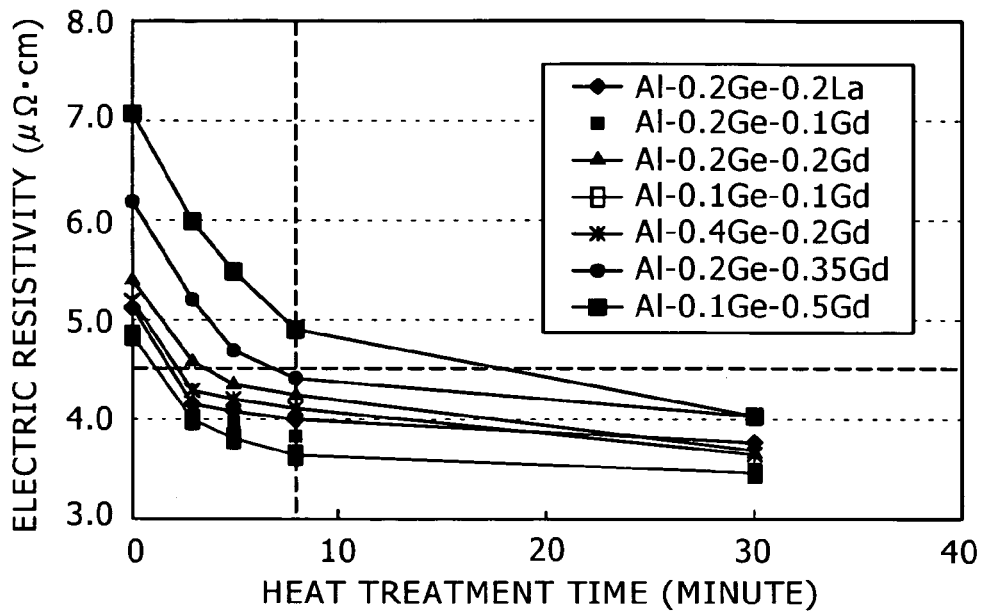
FIG. 22 is a view showing the relation between the heat treatment time and the electric resistivity of the Al alloy film.

Al alloy films with various compositions shown in Table 2 were subjected to a heat treatment at 220° C., and the electric resistivity of each Al alloy film was measured. FIG. 22 shows the correlation between the heat treatment time and the electric resistivity of the Al alloy film. As apparent from FIG. 22, an increase in heat treatment time results in smooth reduction of the electric resistivity of the Al alloy film. However, when the amount of Gd and La added is large, the electric resistivity does not decrease largely. In order to obtain an electric resistivity as low as about 4.5 Ω·cm under the condition of an heating time of about 8 minutes, it is conceivably desirable that the amounts of Gd and La to be added are set each independently, or in total, at 0.45 at % or less, preferably 0.4 at % or less, and further preferably 0.3 at % or less.

TABLE 2

| Sample No. | Composition of Al alloy film (unit of numerical value indicates at %) | Electric resistivity [μΩ · cm] (Immediately after Al deposition) | Electric resistivity [μΩ · cm] Upon 220° C. heating | | | |
|---|---|---|---|---|---|---|
| | | 0 min | 3 min | 5 min | 8 min | 30 min |
| 1 | Al—0.2Ge—0.20La | 5.1 | 4.2 | 4.1 | 4.0 | 3.7 |
| 2 | Al—0.2Ge—0.10Gd | 5.0 | 4.0 | 3.8 | 3.6 | 3.4 |
| 3 | Al—0.2Ge—0.20Gd | 5.5 | 4.6 | 4.4 | 4.3 | 3.6 |
| 4 | Al—0.1Ge—0.10Gd | 4.8 | 4.0 | 3.9 | 3.8 | 3.6 |
| 5 | Al—0.4Ge—0.20Gd | 5.2 | 4.3 | 4.2 | 4.1 | 3.6 |
| 6 | Al—0.2Ge—0.35Gd | 6.2 | 5.2 | 4.7 | 4.4 | 4 |
| 7 | Al—0.1Ge—0.50Gd | 7.1 | 6 | 5.5 | 4.9 | 4 |

Experimental Example 4

The Al—Ge—Gd type films and the Al—Ge—La type films with various compositions shown in Table 3 were subjected to a heat treatment at 220° C. Then, the hillock density and the electric resistivity of each Al alloy film were measured. The measurement of the hillock density was carried out not by examining the hillock formation temperature as in Experimental Example 2, but by counting the number of hillocks formed on the surface of the Al alloy film after heating of the sample at 220° C. for 30 minutes. Namely, under the conditions shown in (2), only the Al alloy film was formed on the glass substrate. Then, a 10-μm width line-and-space pattern was formed, and 220° C.×30 minute vacuum heating treatment was performed. Then, the wiring surface was observed by means of a SEM. Thus, the number of hillocks with a diameter of 0.1 μm or more was counted. The results are shown in Table 3.

On the other hand, for the electric resistivity, the sample was heated at 220° C. for 10 minutes, and then, the measurement was performed with a four-terminal method using the Kelvin pattern. The results are also shown in Table 3.

TABLE 3

| Sample No. | Composition of Al alloy film (unit of numerical value indicates at %) | Hillock density after 220° C. × 30 minutes ($10^9$ · hillocks/$m^2$) | Electric resistivity after 220° C. × 10 minutes (μΩ · cm) |
|---|---|---|---|
| 1 | Al—0.2Ge—0.03Gd | 1.9 | 3.4 |
| 2 | Al—0.2Ge—0.12Gd | 0.2 | 3.4 |
| 3 | Al—0.2Ge—0.26Gd | 0 | 3.9 |
| 4 | Al—0.2Ge—0.03La | 2.3 | 3.5 |
| 5 | Al—0.2Ge—0.10La | 0.9 | 4 |
| 6 | Al—0.2Ge—0.20La | 0.7 | 3.9 |
| 7 | Al—0.2Ge—0.10Gd—0.2Ni | 0 | 4.4 |
| 8 | Al—0.2Ge—0.10Gd—0.3Ni | 0 | 4.5 |
| 9 | Al—0.1Ge | 7.2 | 3.4 |
| 10 | Al—0.2Ge | 5.8 | 3.4 |
| 11 | Al—0.2Ge—0.10Gd—0.2Zn | 2.8 | 4 |
| 12 | Al—0.2Ge—0.10Gd—0.4Zn | 1.8 | 4.1 |

Table 3 indicates that, in the Al—Ge—Gd type material, and the Al—Ge—La type material, the hillock density is controlled small when the content of Gd and La is 0.1 at % or more. Further addition of Ni to the Al alloy film produces the effect of improving the heat resistance, but entails an increase in electric resistivity. For this reason, the amount of Ni to be added is limited. For comparison, the hillock density and the electric resistivity of the Al—Ge type material (binary) are shown. However, when neither Gd nor La are comprised, the heat resistance is remarkably low. Whereas, for the Al—Ge—Gd—Zn type material, the further heat resistance improvement effect due to addition of Zn was not observed.

Experimental Example 5

The contact resistivity of various Al—Ge—X films shown in Table 4 and the ITO film, and the Si direct contact property were measured, respectively. For the measurement of the contact resistivity with the ITO film, the method shown in Experimental Example 1 was used. For all the samples shown in Table 4, a contact resistivity as low as $2.00 \times 10^{-4}$ Ω·$cm^2$ or less can be obtained. When Ni and Cu are added in a composite manner with Ge of sample Nos. 10, 11, 14, and 15, the effect of reducing the contact resistivity is particularly large.

TABLE 4

| Sample No. | Composition of Al alloy film (unit of numerical value indicates at %) | ITO contact resistivity ($\times 10^{-4} \Omega \cdot cm^2$) | IZO contact resistivity ($\times 10^{-4} \Omega \cdot cm^2$) | Si direct contact characteristics | |
|---|---|---|---|---|---|
| | | | | ON current ($\times 10^{-5}$ A) | OFF current ($\times 10^{-11}$ A) |
| 1 | Al—0.04Ge | 1.55 | 1.23 | 2.8 | 180.0 |
| 2 | Al—0.08Ge | 1.40 | 1.14 | 3.0 | 22.0 |
| 3 | Al—0.2Ge | 1.32 | 1.06 | 3.5 | 1.8 |
| 4 | Al—0.2Ge—0.10Gd | 1.14 | 0.90 | 2.7 | 0.6 |
| 5 | Al—0.2Ge—0.20Gd | 1.66 | 1.34 | 3.5 | 0.3 |
| 6 | Al—0.2Ge—0.35Gd | 1.92 | 1.53 | 3.7 | 0.4 |
| 7 | Al—0.4Ge—0.20Gd | 1.20 | 0.97 | 3.9 | 0.6 |
| 8 | Al—0.2Ge—0.10La | 1.99 | 1.60 | 2.2 | 0.3 |
| 9 | Al—0.2Ge—0.20La | 1.92 | 1.54 | 2.8 | 0.5 |
| 10 | Al—0.1Ge—0.10Gd—0.20Ni | 0.90 | 0.72 | 4.1 | 0.8 |
| 11 | Al—0.1Ge—0.10Gd—0.3Ni | 0.86 | 0.69 | 5.0 | 0.4 |
| 12 | Al—0.1Ge—0.10Gd—0.2Zn | 1.98 | 1.58 | 4.9 | 0.7 |
| 13 | Al—0.1Ge—0.10Gd—0.4Zn | 1.45 | 1.16 | 3.0 | 0.9 |
| 14 | Al—0.1Ge—0.10Gd—0.2Cu | 0.80 | 0.61 | 3.5 | 4900.0 |
| 15 | Al—0.1Ge—0.10Gd—0.3Cu | 0.70 | 0.55 | 4.5 | 6400.0 |

Figure 23:
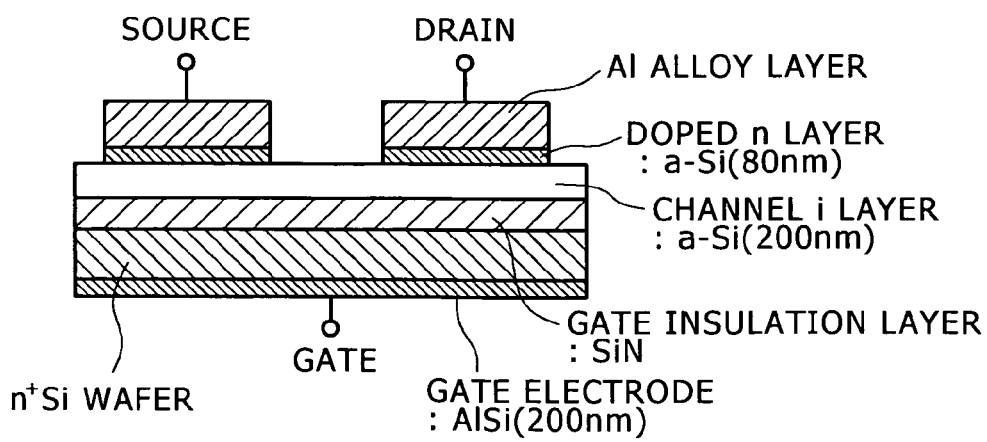
FIG. 23 is a view showing a TEG for evaluation of the Si direct contact property.

On the other hand, Si direct contact propertt (ON current and OFF current of TEG for evaluation described later) was respectively measured in the following manner. First, on the Si wafer, with a sputtering method and a plasma CVD method, a TEG for evaluation having a TFT shown in FIG. 23 was manufactured. The gate length L of the TFT is 10 μm, and the gate width W is 10 μm.

The manufactured TEG for evaluation was subjected to a heat treatment at 300° C. for 30 minutes. In an actual TFT manufacturing process, a heat process is put at the time of formation of the Al alloy film, or later. This is because the proceeding of interdiffusion or interface reaction between Si layer-Al alloy film causes the reduction of ON current and/or the increase in OFF current.

Figure 24:
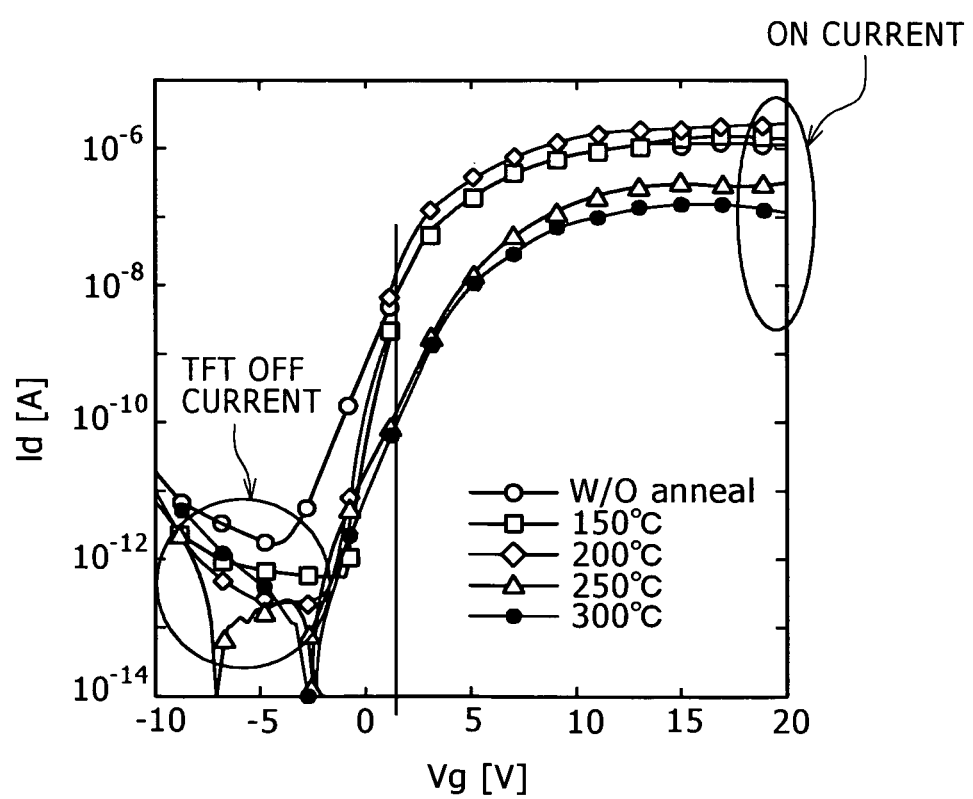
FIG. 24 is a view showing the drain current-gate voltage switching property of the TFT.

After the heat treatment, the drain current-gate voltage switching property of the TFT was measured, thereby to identify the ON current and OFF current thereof. The results are shown in FIG. 24. The drain voltage for the measurement was set at 10 V. The OFF current was defined as the current value at a gate voltage of −3 V; and the ON current, as the voltage at a gate voltage of 20 V.

The ON current is $2.0 \times 10^{-6}$ [A] or more and is favorable for any Al alloy film shown in Table 4.

On the other hand, the OFF current exceeds $1.0 \times 10^{-11}$ [A] for the Al—Ge binary Al alloy films of test Nos. 1 to 3, and the Cu-comprising Al alloy films of sample No. 14 and sample No. 15. This indicates that the OFF current has remarkably increased.

Incidentally, the same also applies to the case where as the semiconductor layer of the TFT, polysilicon is used other than amorphous silicon.

Experimental Example 6

In this Experimental Example and Experimental Example 7 described later, it was examined that the Al alloy film of the present invention has an excellent dry etching property.

First, in Experimental Example 6, the Al alloy film of the present invention has a high etching rate ratio comparable to that of pure Al. Herein, as the inventive example, Al-0.2 at % Ge-0.10 at % Gd was used. For comparison, other than pure Al, Al-2.0 at % Ni which is a conventional typical Al alloy film was used.

Specifically, on a non-alkaline glass substrate (#1737 glass manufactured by Corning Co.) with a diameter of 6 inches, and with a thickness of 0.5 mm, a silicon oxide (SiOx) film with a thickness of 200 nm was deposited at a substrate temperature of about 250° C. Then, the pure Al film or the Al alloy film was deposited under the conditions shown in (2) described above. Then, with g-line photolithography, a positive type photoresist (novolak type resin; TSMR8900 manufactured by TOKYO OHKA KOGYO Co., Ltd., 1.0 μm in thickness) was formed in a stripe with a line width of 2.0 μm.

Then, by means of the dry etching device shown in FIG. 25 described above, dry etching was carried out under the following etching conditions.

(Etching Conditions)
Ar/Cl$_2$/BCl$_3$:300 sccm/120 sccm/60 sccm
Electric power applied to antenna (source RF): 500 W
Substrate bias: 60 W,
Process pressure (gas pressure): 14 mTorr
Substrate temperature: temperature of susceptor (20° C.)

Etching was carried out by changing the etching time in such a range as to achieve an etching depth of 100 to 300 nm, thereby to manufacture samples having different etching depths. Then, with the same method as etching of the silicon nitride (SiNx) film, the resist was released. Then, by means of a stylus type thickness meter ("Dektak II" manufactured by Vecco Co.), the etching thickness of the pure Al or Al alloy film was measured.

Figure 26:
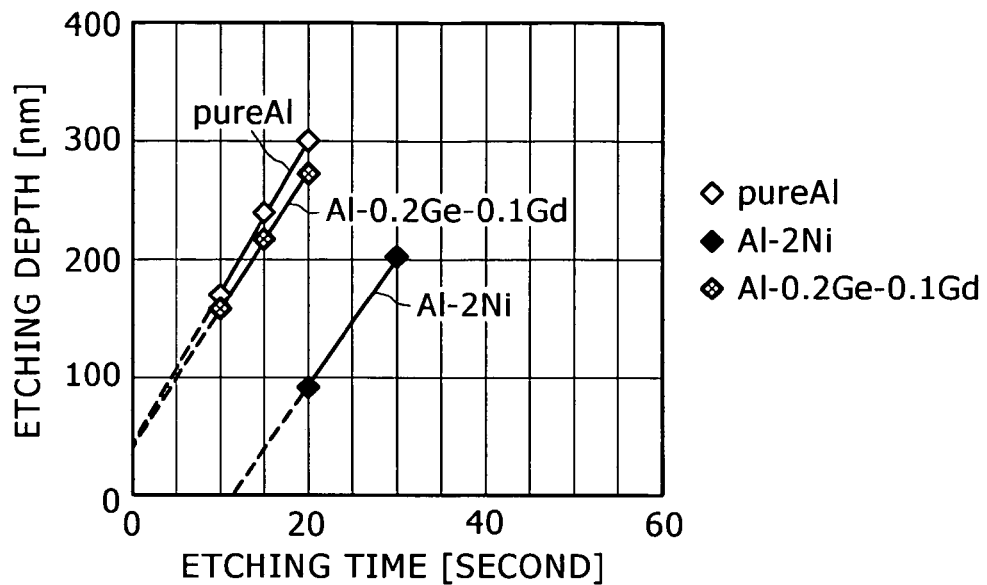
FIG. 26 is a graphed view of the relation between the etching time and the thickness of a pure Al film or an Al alloy film after etching in Example 6.

These results are shown in FIG. 26.

As shown in FIG. 26, it has been confirmed that the etching rate ratio with the Al—Ge—Gd films of the present invention is higher than that with the conventional Al—Ni films, and is roughly comparable to that with pure Al.

Experimental Example 7

In this Experimental Example, the effects of the elements of various Al alloy films shown in Table 5 (Ge, Gd and/or La, Ni) on the dry etching property were examined. The dry etching conditions are the same as in Example 6 described above. The dry etching property was evaluated in the following manner.

(Etching rate ratio) Etching was carried out in the same manner as in Example 6. Then, each thickness (etching thickness) of the pure Al film and respective Al alloy films after etching was measured. These results are subjected to a statistical treatment with the method of least squares, thereby to calculate the etching rate (N2) of the pure Al film and the etching rate (N1) of the Al alloy film, respectively. Thus, the ratio of N1/N2 is referred to as "etching rate ratio".

In this example, the sample with an etching rate ratio of 0.3 or more was rated as success (o).

(Presence or Absence of Residue after Dry Etching)

Various Al alloy films were etched for a time 1.2 times the etching time considered necessary to an etching depth equivalent to the film thickness. For each of the samples, the surface of the glass substrate after releasing the resist was SEM observed (magnification 3000 times), thereby to examine the presence or absence of residues with a diameter (circle equivalent diameter) of 0.5 μm or more. As the measuring visual field, 5 visual fields were used. Thus, the sample, on which the residues were not observed at all the measuring sites (residue zero) when several sites of the substrate surface were measured, was rated as success (o).

In this example, the sample of which the etching rate ratio had been rated as success, and which had no residue after dry etching was rated as "being excellent in dry etching property".

These results are summarized and shown in Table 5. In Table 5, a column of comprehensive evaluation is provided, where o is given for each sample satisfying both the properties, and x is given for each sample of which any one characteristic had been rated as failure (x).

Figure 27:
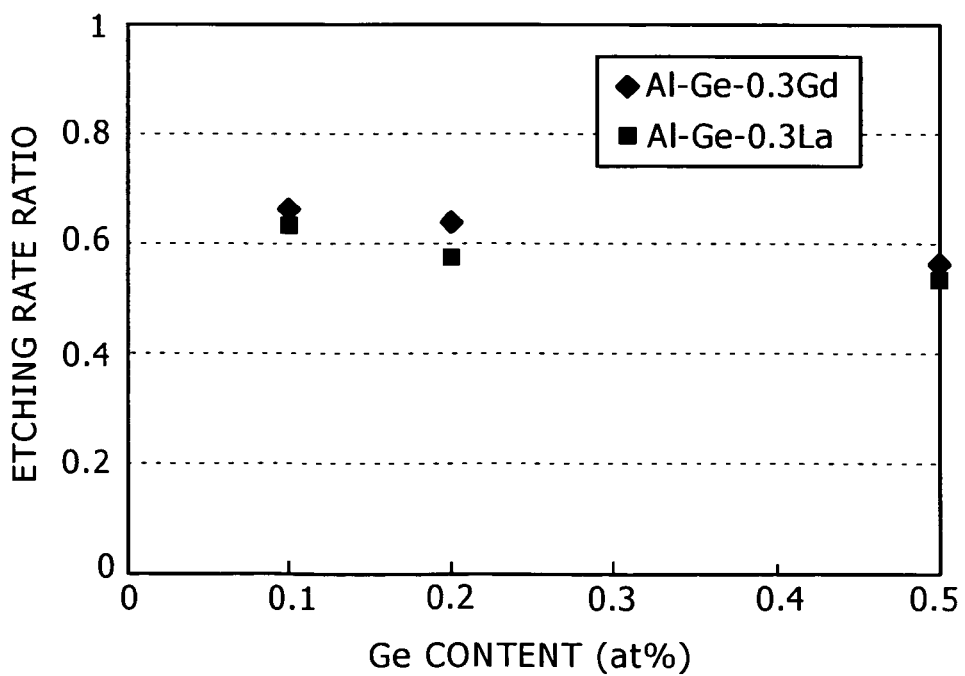
FIG. 27 is a graphed view of the relation between the Ge content in the Al alloy film and the etching rate ratio in Example 7.
Figure 28:
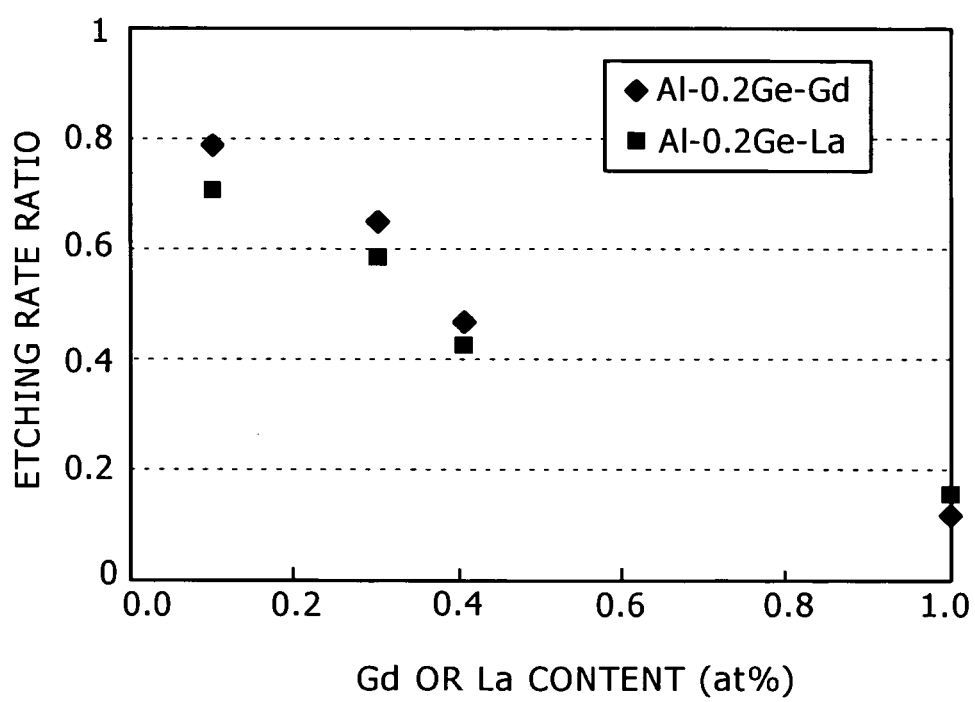
FIG. 28 is a graphed view of the relation between Gd content/La content in the Al alloy film and the etching rate ratio in Example 7.
Figure 29:
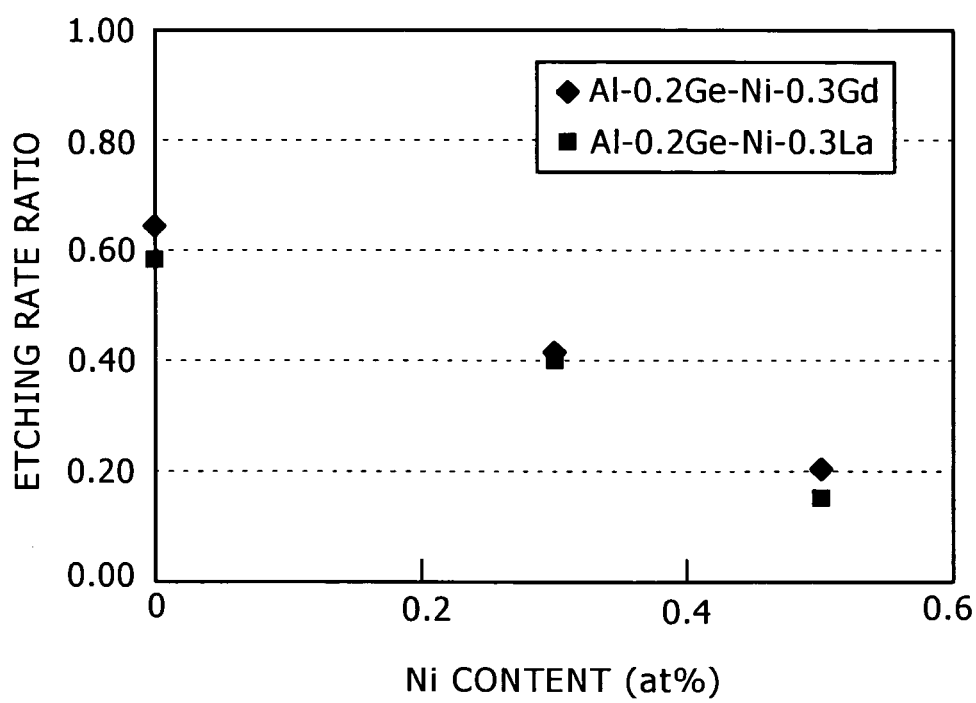
FIG. 29 is a graphed view of the relation between the Ni content in the Al alloy film and the etching rate ratio in Example 7.

Further, FIG. 27 shows the relation between the Ge content in the Al alloy film and the etching rate ratio; FIG. 28 shows the relation between the Gd content and the La content in the Al alloy film and the etching rate ratio; and FIG. 29 shows the relation between the Ni content in the Al alloy film and the etching rate ratio.

TABLE 5

| Sample No. | Composition of Al alloy film (unit of numerical value indicates at %) | Dry etching characteristics | | |
|---|---|---|---|---|
| | | Etching residue | Etching rate ratio | Comprehensive evaluation |
| 1 | Al—0.5Ge—0.10Gd | O | O | O |
| 2 | Al—0.2Ge—0.10Gd | O | O | O |
| 3 | Al—0.2Ge—0.30Gd | O | O | O |
| 4 | Al—0.2Ge—0.40Gd | X | O | X |
| 5 | Al—0.2Ge—0.80Gd | X | X | X |
| 6 | Al—0.5Ge—0.10La | O | O | O |
| 7 | Al—0.2Ge—0.10La | O | O | O |
| 8 | Al—0.2Ge—0.30La | O | O | O |
| 9 | Al—0.2Ge—0.40La | X | O | X |
| 10 | Al—0.2Ge—1.00La | X | X | X |
| 11 | Al—0.2Ge—0.3Ni—0.30Gd | O | O | O |
| 12 | Al—0.2Ge—0.5Ni—0.30Gd | O | X | X |
| 13 | Al—0.2Ge—0.3Ni—0.30La | O | O | O |
| 14 | Al—0.2Ge—0.5Ni—0.30La | O | X | X |

As shown in Table 5, the Al—Ge—Gd films of Nos. 1 to 4, the Al—Ge—La films of Nos. 6 to 9, the Al—Ge—Gd—Ni film of No. 11, and the Al—Ge—La—Ni film of No. 13, which satisfy the requirements of the present invention, are all excellent in dry etching property.

In contrast, for the Al—Ge—Gd film of No. 5 with high Gd content, and the Al—Ge—La film of No. 10 with a high La content, in both, residues after etching were observed, and the etching rate ratio was also reduced. Whereas, the Al—Ge—Gd—Ni film of No. 12 and the Al—Ge—La—Ni film of No. 14 are both the examples which have a high Ni content, and have a high total content of Ge and Ni. Although residues after etching were not observed, the etching rate ratio was reduced.

The results of consideration of the effects of respective elements exerted on the etching rate ratio based on the experimental results are as follows.

First, a consideration will be given to the effects of Ge on the Al—Ge—Gd films and the Al—Ge—La films.

As shown in FIG. 27, when the Ge content is within the range specified in the present invention (0.05 to 0.5 at %), the etching rate ratio is roughly constant at about 0.6. Further, as shown in Table 5, when the content falls within the range, residues after etching are not also observed. Therefore, it has been confirmed that the Al alloy film of the present invention shows a favorable dry etching property irrespective of the content of Ge.

Then, a consideration will be given to the effects of Gd/La on the Al—Ge—Gd films and the Al—Ge—La films.

As shown in FIG. 28, it is indicated that the etching rate ratio increases with a decrease in content of Gd or La. In order to satisfy the etching rate ratio of 0.3 or more specified in the present invention, the upper limit of the total content of Gd and/or La is required to be set at 0.35 at %. When the upper limit was 0.4 at %, it was not possible to obtain desirable property.

Then, a consideration will be given to the effects of Ni exerted on the Al—Ge—Gd films and the Al—Ge—La films.

Also in Ni, the same tendency as that of Gd/La described above is observed. As shown in FIG. 29, the etching rate ratio increases with a decrease in content of Ni. In order to satisfy the etching rate ratio of 0.3 or more specified in the present invention, the upper limit of the Ni content is required to be set at 0.35 at %. When the upper limit was 0.4 at o, it was not possible to obtain desirable property.

The present invention was described in details by reference to specific embodiments. However, it is apparent to those skilled in the art that various changes and modifications may be made without departing from the spirit and scope of the present invention.

Incidentally, this application is based on Japanese Patent application (Japanese Patent Application No. 2006-324494) filed Nov. 30, 2006, and Japanese Patent application (Japanese Patent Application No. 2007-168298) filed Jun. 26, 2007, the entire contents of which are hereby incorporated by reference.

Further, all references herein cited are entirely incorporated.

INDUSTRIAL APPLICABILITY

In accordance with the present invention, it is possible to provide an Al alloy film for a display device configured as follows: the Al alloy film can be directly connected to the transparent pixel electrode including a conductive oxide film without a barrier metal layer interposed therebetween, and even when a heat treatment temperature as relatively low as about 220° C. is applied thereto, sufficiently low electric resistivity and excellent heat resistance are ensured; and a display device using the same.

The invention claimed is:

1. An Al alloy film, comprising:
   Al,
   Ge in an amount of 0.05 to 0.5 at %, and
   Gd, La, or both in a total amount of 0.05 to 0.45 at %.

2. A display device comprising an amorphous Si layer or a polycrystalline Si layer on a substrate, and
   an Al alloy film directly connected to the amorphous Si layer or polycrystalline Si layer,
   wherein the Al alloy film comprises:
   Al,
   Ge in an amount of 0.05 to 0.5 at %, and
   Gd, La, or both in a total amount of 0.05 to 0.45 at %.

3. The Al alloy film of claim 1, wherein:
the total amount of Gd, La, or both is 0.05 to 0.35 at %.

4. The Al alloy film of claim 1, further comprising:
Ni in an amount of 0.05 to 0.35 at %,
wherein a total amount of Ge and Ni is 0.45 at % or less.

5. The display device of claim 2,
wherein the total amount of Gd, La, or both is 0.05 to 0.35 at %.

6. The display device of claim 2,
wherein the Al alloy film further comprises Ni in an amount of 0.05 to 0.35 at %, and
a total amount of Ge and Ni is 0.45 at % or less.

7. A display device, comprising:
the Al alloy film of claim 1, and
a thin film transistor.

8. The display device of claim 2, further comprising a thin film transistor.

9. A display device, comprising:
a conductive oxide film,
a gate electrode of a thin film transistor, the gate electrode comprising the Al alloy film of claim 1, directly connected to the conductive oxide film and
a scanning line comprising the Al alloy film of claim 1, directly connected to the conductive oxide film.

10. A display device, comprising:
a conductive oxide film,
a source electrode, a drain electrode, or both a source electrode and a drain electrode of a thin film transistor, wherein the source electrode, drain electrode, or both comprise the Al alloy film of claim 1 and are directly connected to the conductive oxide film, and
a signal line comprising the Al alloy film of claim 1, wherein the signal line is directly connected to the conductive oxide film.

11. The display device of claim 2, further comprising:
a source electrode, a drain electrode, or both a source electrode and a drain electrode of a thin film transistor, wherein the source electrode, drain electrode, or both comprise the Al alloy film, and
a signal line comprising the Al alloy film.

12. The display device of claim 7, wherein a source electrode, a drain electrode, or both a source electrode and a drain electrode of the thin film transistor, and a signal line are of a material of a gate electrode of the thin film transistor and of a scanning line.

13. The display device of claim 8, wherein a source electrode, a drain electrode, or both a source electrode and a drain electrode of the thin film transistor, and a signal line are of a material of a gate electrode of the thin film transistor and of a scanning line.

14. The display device of claim 9, wherein a source electrode, a drain electrode, or both a source electrode and a drain electrode of the thin film transistor, and a signal line are of a material of the gate electrode and of the scanning line.

15. The display device of claim 10, wherein the source electrode, the drain electrode, or both the source electrode and the drain electrode and the signal line are of a material of a gate electrode of the thin film transistor and of a scanning line.

16. The display device of claim 11, wherein the source electrode, the drain electrode, or both the source electrode and the drain electrode, and the signal line are of a material of a gate electrode of the thin film transistor and of a scanning line.

17. The display device of claim 7, further comprising:
a conductive oxide film comprising at least one composite oxide selected from the group consisting of indium oxide, zinc oxide, tin oxide, and titanium oxide.

18. The display device of claim 9, wherein the conductive oxide film comprises at least one composite oxide selected from the group consisting of indium oxide, zinc oxide, tin oxide, and titanium oxide.

19. The display device of claim 10, wherein the conductive oxide film comprises at least one composite oxide selected from the group consisting of indium oxide, zinc oxide, tin oxide, and titanium oxide.

20. The display device of claim 7, wherein an electric resistivity of the Al alloy film is 4.5 $\mu\Omega\cdot$cm or less.

21. The display device of claim 8, wherein an electric resistivity of the Al alloy film is 4.5 $\mu\Omega\cdot$cm or less.

22. The display device of claim 9, wherein an electric resistivity of the Al alloy film is 4.5 $\mu\Omega\cdot$cm or less.

23. The display device of claim 10, wherein an electric resistivity of the Al alloy film is 4.5 $\mu\Omega\cdot$cm or less.

24. The display device of claim 11, wherein an electric resistivity of the Al alloy film is 4.5 $\mu\Omega\cdot$cm or less.

25. A sputtering target, comprising:
Al,
Ge in an amount of 0.05 to 0.5 at %, and
Gd, La, or both in a total amount of 0.05 to 0.45 at %.

26. The sputtering target of claim 25, further comprising:
Ni in an amount of 0.05 to 0.35 at %,
wherein a total amount of Ge and Ni is 0.45 at % or less.

* * * * *